(12) United States Patent
Meitl et al.

(10) Patent No.: US 10,510,937 B2
(45) Date of Patent: Dec. 17, 2019

(54) INTERCONNECTION BY LATERAL TRANSFER PRINTING

(71) Applicant: X-Celeprint Limited, Cork (IE)

(72) Inventors: Matthew Meitl, Durham, NC (US); Tanya Yvette Moore, Hurdle Mills, NC (US); Ronald S. Cok, Rochester, NY (US); Salvatore Bonafede, Chapel Hill, NC (US); Brook Raymond, Cary, NC (US); Christopher Andrew Bower, Raleigh, NC (US); Carl Ray Prevatte, Jr., Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 16/186,173

(22) Filed: Nov. 9, 2018

(65) Prior Publication Data

US 2019/0157532 A1  May 23, 2019

Related U.S. Application Data

(60) Provisional application No. 62/589,913, filed on Nov. 22, 2017.

(51) Int. Cl.
*H01L 23/538* (2006.01)
*H01L 41/083* (2006.01)
(Continued)

(52) U.S. Cl.
CPC ............ *H01L 33/62* (2013.01); *H01L 33/483* (2013.01); *H01L 23/5385* (2013.01);
(Continued)

(58) Field of Classification Search
CPC ... H01L 33/62; H01L 33/483; H01L 23/5385; H01L 25/0657; H01L 41/047; H01L 41/083; H01L 2225/0652
(Continued)

(56) References Cited

U.S. PATENT DOCUMENTS 7,691,541 B2 *  4/2010  Crocker ................. C23C 18/14
                                                          427/140
8,383,506 B1 *  2/2013  Golda ............... H01L 21/76898
                                                          257/623

(Continued)

*Primary Examiner* — Ly D Pham
(74) *Attorney, Agent, or Firm* — William R. Haulbrook; Michael D. Schmitt; Choate, Hall & Stewart LLP

(57) ABSTRACT

A transfer print structure comprises a destination substrate having a substrate surface and one or more substrate conductors disposed on or in the destination substrate. One or more interconnect structures are disposed on and protrude from the destination substrate in a direction orthogonal to the substrate surface. Each interconnect structure comprises one or more notches, each notch having an opening on an edge of the interconnect structure and extending at least partially through the interconnect structure in a direction parallel to the substrate surface from the edge and a notch conductor disposed at least partially in the notch and electrically connected to one of the substrate conductors. In some embodiments, an electronic component comprising connection posts is transfer printed into electrical contact with a corresponding notch conductor by laterally moving the electronic component over the substrate surface to electrically contact the connection post to the notch conductor.

20 Claims, 19 Drawing Sheets

(51) Int. Cl.
*H01L 23/12* (2006.01)
*H01L 33/62* (2010.01)
*H01L 33/48* (2010.01)
H01L 41/047 (2006.01)
H01L 25/065 (2006.01)

(52) U.S. Cl.
CPC ........ *H01L 25/0657* (2013.01); *H01L 41/047* (2013.01); *H01L 41/083* (2013.01); *H01L 2225/0652* (2013.01)

(58) Field of Classification Search
USPC .... 257/737, E25.013, E25.023, E23.07, 777
See application file for complete search history.

(56) References Cited

U.S. PATENT DOCUMENTS

| | | | |
|---|---|---|---|
| 8,415,771 B1* | 4/2013 | Golda | B81C 99/0025 257/621 |
| 2012/0217645 A1* | 8/2012 | Pagaila | H01L 21/486 257/774 |
| 2018/0033853 A1* | 2/2018 | Bower | H01L 27/3288 |

* cited by examiner

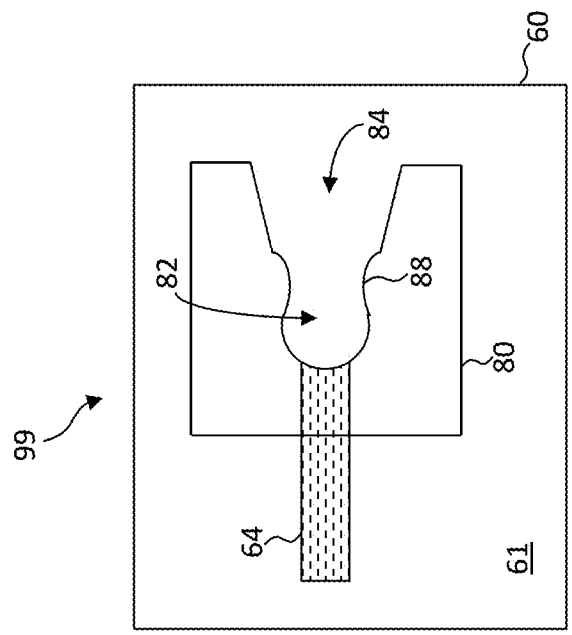
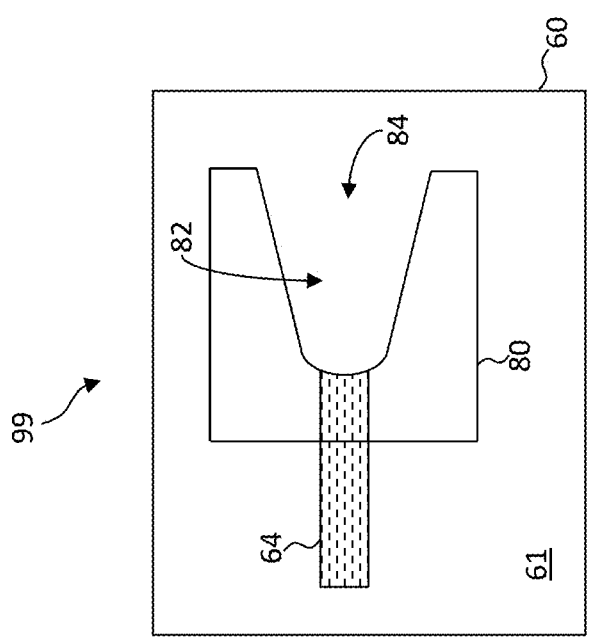
FIG. 2A
FIG. 2B

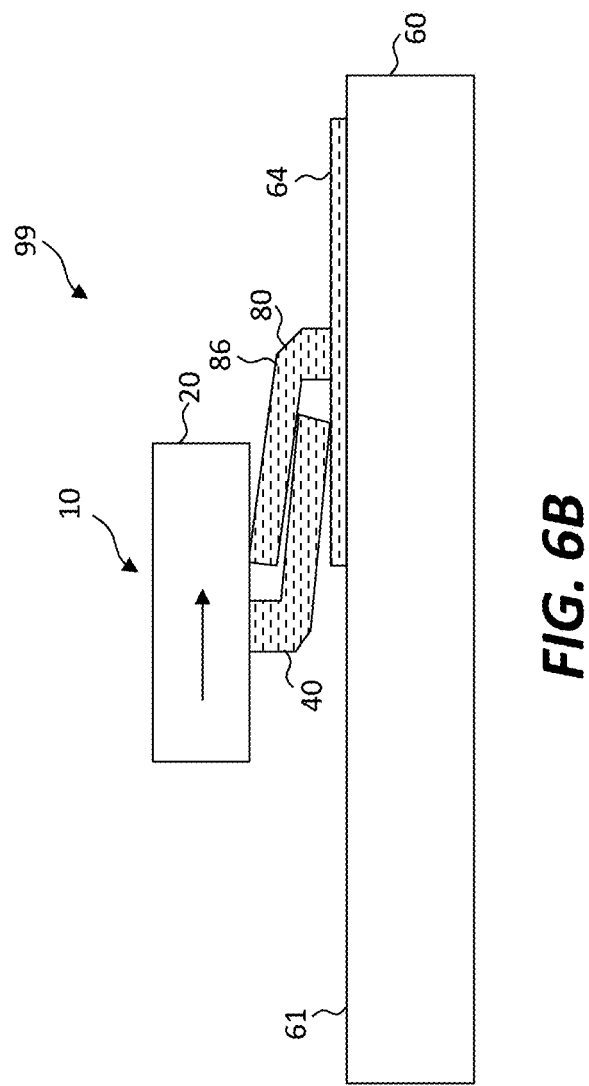

INTERCONNECTION BY LATERAL TRANSFER PRINTING

PRIORITY APPLICATION

This application claims the benefit of U.S. Provisional Patent Application No. 62/589,913, filed on Nov. 22, 2017, entitled Interconnection by Lateral Transfer Printing, the disclosure of which is incorporated by reference herein in its entirety.

CROSS REFERENCE TO RELATED APPLICATION

Reference is made to U.S. Pat. No. 8,889,485, entitled Methods for Surface Attachment of Flipped Active Components by Christopher Bower and to U.S. patent application Ser. No. 14/822,864, entitled Chiplets with Connection Posts by Prevatte et al., filed Aug. 10, 2015, the disclosures of which are incorporated by reference herein in their entirety.

TECHNICAL FIELD

The present disclosure relates generally to structures and methods for electrically interconnecting integrated circuit devices to contact pads on a substrate using transfer printing (e.g., micro-transfer printing).

BACKGROUND

Substrates with electronically active components such as transistors or light-emitting diodes distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

One method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches, inter alia, transferring light-emitting, light-sensing, or light-collecting semiconductor elements from a wafer substrate to a destination substrate or backplane.

In such methods, it is generally necessary to electrically connect the small integrated circuits or chiplets to electrically conductive elements such as contact pads on the destination substrate. By applying electrical signals to conductors on the destination substrate the small integrated circuits are energized and made operational. The electrical connections between the small integrated circuits and the contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the contact pads on the destination substrate. Additional layers, such as interlayer dielectric insulators can also be used or required. Photolithographic processing can be expensive and require several manufacturing steps. Moreover, the topographical structure of the small integrated circuits over the destination substrate can complicate electrical interconnection by photolithographic processing (e.g., due to height differences between the substrate and the integrated circuit).

There is a need, therefore, for structures and methods that enable the electrical interconnection of small integrated circuits, such as transfer printed (e.g., micro-transfer printed) chiplets or light-emitting diodes, to destination substrates.

SUMMARY

In accordance with certain embodiments, a micro-transfer print structure comprises a destination substrate having a substrate surface and one or more substrate conductors disposed on or in the destination substrate or substrate surface. One or more interconnect structures are disposed on and protrude from the destination substrate in a direction orthogonal to the substrate surface. Each interconnect structure comprises one or more notches and each notch has an opening on an edge of the interconnect structure and extends at least partially through the interconnect structure in a direction parallel to the substrate surface from the edge of the interconnect structure and comprises a notch conductor disposed at least partially in the notch and electrically connected to one of the substrate conductors.

In various embodiments, the interconnect structure can comprise a dielectric layer and an electrical conductor layer disposed at least partly on the dielectric layer, the electrical conductor layer forming at least a part of the notch conductor. The interconnect structure can be a metal structure or metal oxide structure. The notch conductor can comprise a metal or a metal oxide. The notch can extend only partially through the interconnect structure in a direction parallel to the substrate surface. The notch can have opposing ends and one end is wider than the other end in a direction parallel to the substrate surface. The wider end can be at the edge of the interconnect structure or at the opposite end. The notch can have opposing ends and a mid-portion of the notch between the ends is narrower than portions of the notch to either side of the mid-portion in a direction parallel to the substrate surface.

In some configurations, the notch can have a slot portion adjacent to the substrate surface that is wider than a portion of the notch on a side of the slot portion opposite the substrate surface in a direction orthogonal to the substrate surface.

In some embodiments, one interconnect structure comprises two notches, and the notch conductors of the two notches are electrically separate. In some embodiments, one interconnect structure comprises two notches, and the notch conductors of the two notches are electrically connected.

In some embodiments, one or more electronic components can each comprise one or more electrically conductive connection posts in electrical contact with a notch conductor of a corresponding notch. In some embodiments, the electronic component comprises a dielectric substrate having one or more electronic devices disposed on the dielectric substrate and at least one of the electronic devices is electrically connected to a connection post. A contact pad can be disposed on the substrate surface and electrically connected to the notch conductor and to the connection post. The contact pad can be disposed on the substrate surface at least partially within the notch and can be between the substrate and the interconnect structure. In some embodiments, the contact pad is electrically connected to the notch conductor and in direct physical contact with the connection post. The connection post can have a diameter that is substantially the same as a width of at least a portion of the opening and the connection post can be held in place by the notch.

In some embodiments, each notch extends only partially through the interconnect structure in a direction parallel to the substrate surface, the notch has a wide end that is wider and closer to the edge of the interconnect structure than an opposing narrow end in a direction parallel to the substrate surface, the narrow end extending into the interconnect structure and having a width that is substantially the same as or less than the diameter of the corresponding connection post. The connection posts can each have a bulb on the distal end of the connection post that has a diameter that is greater than a diameter of the connection post between the bulb and the proximal end of the connection post.

In some embodiments, the connection posts each comprise an L shape with a portion extending away from and substantially orthogonal to a substrate of the electronic component and a portion extending substantially parallel to the substrate. The interconnect structure forms a rail and the connection posts forms a socket with a socket opening. At least one of the rail and the socket opening is wedge shaped.

In certain configurations, each notch is disposed at least partially between at least a portion of the interconnect structure and the substrate surface.

A method of making a micro-transfer print system according to some embodiments of the present disclosure comprises providing a micro-transfer print structure, providing one or more electronic components on a source wafer, each electronic component comprising one or more electrically conductive connection posts, and providing a transfer device (e.g., a micro-transfer printing stamp). The electronic component is contacted with the transfer device to remove the electronic component from the source wafer and adhere the electronic component to the transfer device. The electronic component is transported to the destination substrate and laterally moved over the substrate surface to electrically contact the connection post to the notch conductor.

In some embodiments, each notch extends only partially through the interconnect structure in a direction parallel to the substrate surface, each notch has opposing ends, and one end is narrower than the other end in a direction parallel to the substrate surface. The narrower end extends into the corresponding interconnect structure and has a width that is substantially the same as or less than the diameter of the corresponding connection post. Some methods comprise laterally moving the electronic component so that each connection post is substantially in contact with the narrower end of a notch.

In some embodiments, a contact pad is disposed on the substrate surface within (e.g., beneath) a notch, the contact pad electrically connected to the notch conductor of the notch and methods comprise moving the electronic component into direct physical contact with the contact pad. In some embodiments, the electronic component comprises one or more of a semiconductor component, an integrated circuit, a CMOS circuit, a compound semiconductor component, or an LED.

In accordance with some embodiments, electronic components incorporating one or more electronic devices having active elements such as transistors, diodes, or light-emitting diodes and passive elements such as resistors, capacitors, and conductors are micro transfer printed from a native source wafer to a non-native destination substrate or backplane. Electronic components include an electrically conducting connection post that protrudes from a side of the electronic component and is brought into electrical and physical contact with a notch conductor in a notch of a destination substrate interconnect structure (and into electrical and physical contact with a contact pad, if present) to form an electrical connection between the electronic component and the destination substrate. In some embodiments, any one or combination of connection posts, notch conductors and contact pads can be deformed or crumpled and the connection posts can be driven into or through the notch conductors or backplane contact pads, thereby wedging the connection posts in the interconnect structure notches to adhere the connection posts to the destination substrate interconnect structures and form an electrical contact between the electronic component and the destination substrate. In some embodiments, as a consequence, each connection post can be welded to electrical contacts such as the notch conductor or the contact pad.

An additional heat treatment can be provided to facilitate a welding. In some embodiments, a layer of metal, for example a solder can be provided on either the surface of a connection post or a destination substrate notch conductor or contact pad, or both, that can be heated, causing the solder to reflow and thereby both adhere and electrically connect the connection post to the destination substrate notch conductor or contact pad. Moreover, an adhesive can be provided on a destination substrate or electronic component to adhere the electronic component to the destination substrate. An adhesive can be patterned, can be located between an electronic component and a destination substrate, or can under-fill the volume between the electronic component and the destination substrate. An adhesive can cover a destination substrate contact pad and a connection post can extend through the adhesive.

An electronic component can be a transfer printable (e.g., micro-transfer printable) electronic component and can include a tether that fractures, separates, or disengages when the electronic component is transfer printed (e.g., transfer printed). Electronic devices in an electronic component can also be transfer printed (e.g., micro-transfer printed) to the electronic component, for example onto a component substrate, and can also include a similar tether that fractures, separates, or disengages when the electronic device(s) are transfer printed. Thus, an electronic component can be made using micro-transfer printing and the electronic component itself can be micro-transfer printed. Connection posts can have an electrically conductive layer formed over a core of a different material, for example a metal layer formed over a dielectric core, such as silicon oxide or silicon nitride.

In some embodiments, an electronic component includes a plurality of electronic devices, such as integrated circuits, disposed in contact with a dielectric layer or component substrate. Each electronic device can have a substrate separate (e.g., independent and distinct) from a component substrate and a destination substrate. The electronic devices have device electrical contacts. In some embodiments, an electronic component is an LED component including at least one LED electronic device having LED electrical contacts for providing electrical power to the LED. The electronic component has a post side and an opposing stamp side, and a plurality of electrical conductors. The stamp side may be configured for contact with a stamp pillar (for example, of an elastomeric stamp) for micro-transfer printing. At least one electrical conductor is electrically connected to each of the device electrical contacts. One or more electrically conductive connection posts protrude from the dielectric layer or component substrate in a direction opposite to the stamp side. Each connection post is electrically connected to at least one of the electrical conductors.

In some embodiments, device electrical contacts are provided on a common side of an electronic component. A dielectric layer or a dielectric component substrate can be provided on the connection post side or on the stamp side of the electronic component opposite the connection posts. If the dielectric layer or dielectric substrate is provided on the connection post side, the connection posts protrude beyond the dielectric layer or dielectric component substrate. If a dielectric layer is provided on the stamp side of the electronic component, the dielectric layer can serve as an encapsulation and environmental protection layer that also provides addition mechanical support to the electronic component. A dielectric layer can be a component substrate on which other elements of the component are formed and can be at least partially transparent so that light can pass through the dielectric layer.

A printable electronic component can include a plurality of electronic devices with device electrical contacts connected to electrical conductors. For example, the an electronic component can include one or more integrated circuits, light-emitting diodes, light-emitting diode lasers, light-sensing diodes or transistors, opto-electronic devices, an acoustic wave device, transistors, capacitors, resistors, inductors, and antennas or electrically conductive wires to electrically connect electronic devices. A printable electronic component can also include electronic devices such as control circuitry or an integrated circuit controller chiplet electrically connected to the connection posts and the device electrical contacts. The integrated circuit controller chiplet can control other electronic devices, such as one or more LEDs.

A printable electronic component wafer includes a wafer comprising a wafer material, a patterned sacrificial layer forming sacrificial portions spaced apart by anchors formed on or in the wafer (e.g., portions of the wafer), and a plurality of printable electronic components. Each printable electronic component is formed or disposed entirely over a sacrificial portion and connected to at least one anchor by at least one tether. The sacrificial portions can comprise an etchable material other than the wafer material, the sacrificial portions can comprise an anisotropically etchable portion of the wafer material, or the sacrificial portions can be removed thereby defining a gap between the printable electronic component and the wafer material.

A method of making a printable electronic component wafer includes providing a wafer comprising a wafer material, forming a patterned sacrificial layer having sacrificial portions spaced apart by anchor portions formed on or in the wafer, and providing a plurality of electronic devices, where each electronic device is disposed entirely over a sacrificial portion. In some embodiments, the electronic devices are micro-transfer printed on or over the sacrificial portions and each electronic device can include a fractured or separated tether. In some embodiments, the electronic devices are formed on or over the sacrificial portions. One or more connection post forms can be made in each sacrificial portion and electrodes can be formed in the connection post forms to make one or more connection posts electrically connected to the electronic devices. The sacrificial portions can be etched so that one or more tethers connect the electronic component to one or more anchors and a gap is formed between the electronic component and the wafer material. Thus, in some embodiments, each electronic component is disposed entirely over a sacrificial portion and can be micro-transfer printed with a transfer device (e.g., stamp).

Because the electronic components can be made using integrated circuit photolithographic techniques having a relatively high resolution and cost and a destination substrate, for example a printed circuit board, can be made using printed circuit board techniques having a relatively low resolution and cost, contact pads on the destination substrate can be much larger than connection posts or electrical contacts on an electronic component, facilitating the use of multiple connection posts with a common contact pad, thereby reducing electrical faults and manufacturing costs.

In certain embodiments, a destination substrate comprises a member selected from the group consisting of polymer, plastic, resin, polyimide, PEN, PET, metal, metal foil, glass, a semiconductor, and sapphire. In certain embodiments, a destination substrate has a thickness from 5 to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

In certain embodiments, notch conductors or contact pads comprise a material that is softer than that of a connection post. In certain embodiments, connection posts comprise a material that is softer than that of notch conductors or contact pads. In certain embodiments, a conductive material other than a material of the notch conductors or contact pads or the connection post (or both) adheres or electrically connects a notch conductor or contact pad to a connection post. In certain embodiments, a notch conductor or contact pad is welded to a connection post.

In certain embodiments, a method includes a method of making a printable electronic component, including: providing a forming substrate having two or more forms in a surface of the substrate; disposing a patterned layer of conductive material at least in the forms to make connection posts; disposing a first dielectric layer over the patterned layer of conductive material and the forming substrate; disposing or forming one or more electronic devices having device electrical contacts on the first dielectric layer; forming electrodes electrically connecting the connection posts to the device electrical contacts, for example through a via in the first dielectric layer; and defining the printable electronic component, for example by etching, to form a release layer and anchors in the forming substrate connected by tethers to the printable electronic component.

In certain embodiments, the method includes providing a destination substrate comprising notches comprising notch conductors or contact pads and micro transfer printing the printable electronic component to the destination substrate so that each connection post is in contact with, extends into, or extends through a notch conductor or contact pad, or both, of a destination substrate interconnect structure to electrically connect the notch conductors or contact pads to the connection posts and the device electrical contacts.

In certain embodiments, a micro-transfer printable electronic component used in structures and/or methods disclosed herein comprises: a dielectric layer (for example, forming a component substrate); a plurality of electronic devices disposed in contact with the component substrate, each electronic device having an individual substrate separate and independent from the component substrate and device electrical contacts for providing electrical power to the electronic device, the electronic device having a post side and an opposing stamp side; a plurality of electrical conductors, such as electrodes, at least one electrical conductor electrically connected to each of the device electrical contacts; and one or more electrically conductive connection posts that protrude from the dielectric layer in a direction opposite to the stamp side, each connection post electrically connected to at least one of the electrical conductors.

In certain embodiments, the dielectric component substrate is on or adjacent to the post side or the electronic component comprises one or more dielectric layers that are on both the stamp side and the post side.

In certain embodiments, the dielectric layer is transparent. The electronic devices can comprise one or more LEDs, and the LEDs can emit light through the transparent dielectric layer.

In certain embodiments, the electronic devices comprise one or more LEDs and the LEDs emit light in a direction opposite the transparent dielectric layer.

In certain embodiments, the device electrical contacts are on a common side of the electronic device.

In certain embodiments, the common side is the post side.

In certain embodiments, the common side is the stamp side.

In certain embodiments, the electronic devices comprise one or more LEDs and the LEDs emit light through the post side.

In certain embodiments, the electronic devices comprise one or more LEDs and the LEDs emit light through the stamp side.

In certain embodiments, the micro-transfer printable electronic component includes a tether or a broken (e.g., fractured) or separated tether. In some embodiments, one or more of the electronic devices includes a broken (e.g., fractured) or separated tether.

In certain embodiments, the electronic devices include a circuit controller electrically connected to at least one connection post and to at least one device electrical contact.

In certain embodiments, the transfer print structure comprises a destination substrate having a plurality of contact pads or electrical conductors, wherein at least one connection post of an electronic component is in electrical contact with at least one contact pad or at least one electrical conductor.

In certain embodiments, the transfer print structure includes an adhesive that adheres the printable electronic component to the destination substrate.

In certain embodiments, the adhesive includes an electrically conductive solder.

In certain embodiments, the electronic devices are one or more of an integrated circuit, an opto-electronic device, an acoustic wave device, transistors, capacitors, resistors, inductors, photo-diodes, photo-transistors, light-emitting diodes, and antennas.

In certain embodiments, one or more of the electronic devices is a passive circuit providing an electrical connection between two or more of the electrically conductive connection posts.

In certain embodiments, the one or more of the electronic devices is an active circuit including one or more transistors, diodes, or light-emitting diodes.

In certain embodiments, the electronic component is an LED component having one or more LED electronic devices and an optional circuit controller and the device electrical contacts include LED electrical contacts.

In certain embodiments, the connection posts comprise an electrically conductive layer formed over a core of a different material.

In certain embodiments, the core material is one or more of a dielectric, silicon dioxide, and silicon nitride.

In certain embodiments, the connection posts extend or electrically contact an electrical conductor through a via in a dielectric layer.

In certain embodiments, the electronic component is unpackaged and the electronic devices include one or more bare dies.

In certain embodiments, the electronic component or electronic device has at least one of a width, length, and height from 2 to 500 µm (e.g., 2 to 5 µm, 5 to 10 µm, 10 to 20 µm, 20 to 50 µm, 50 to 100 µm, 100 to 250 µm, or 250 to 500 µm).

In some aspects, the present disclosure provides a transfer print structure, comprising: a destination substrate having a substrate surface and one or more substrate conductors disposed on or in the destination substrate; and one or more interconnect structures disposed on and protruding from the destination substrate in a direction orthogonal to the substrate surface, each interconnect structure comprising one or more notches, each notch (i) having an opening on an edge of the interconnect structure and extending at least partially through the interconnect structure in a direction parallel to the substrate surface from the edge of the interconnect structure, (ii) comprising a notch conductor disposed at least partially in the notch and (iii) electrically connected to at least one of the one or more substrate conductors.

In certain embodiments, each of the one or more interconnect structures comprises a dielectric layer and an electrical conductor layer disposed at least partly on the dielectric layer, the electrical conductor layer forming at least a portion of the notch conductor of the one or more notches.

In certain embodiments, each of the one or more interconnect structures is a metal structure or metal oxide structure. In certain embodiments, each of the one or more notches conductor comprises a metal or a metal oxide.

In certain embodiments, each of the one or more notches extends only partially through the interconnect structure in a direction parallel to the substrate surface. In certain embodiments, each of the one or more notches has opposing ends and one end is wider than the other end in a direction parallel to the substrate surface.

In certain embodiments, each of the one or more notches has opposing ends and a mid-portion of the notch between the ends is narrower than portions of the notch to either side of the mid-portion in a direction parallel to the substrate surface.

In certain embodiments, each of the one or more notches has a slot portion adjacent to the substrate surface that is wider than a portion of the notch on a side of the slot portion opposite the substrate surface in a direction orthogonal to the substrate surface.

In certain embodiments, at least one of the one or more interconnect structures comprises two notches, and the notch conductors of the two notches are electrically separate. In certain embodiments, at least one of the one or more interconnect structures comprises two notches, and the notch conductors of the two notches are electrically connected.

In certain embodiments, the transfer print structure comprises one or more electronic components, each electronic component comprising one or more electrically conductive connection posts, wherein each of the one or more connection posts is in electrical contact with the notch conductor of a corresponding notch. In certain embodiments, each of the one or more electronic components comprises a dielectric substrate and one or more electronic devices disposed on the dielectric substrate, wherein at least one of the one or more electronic devices is electrically connected to a connection post of the electronic component. In certain embodiments, the transfer print structure comprises a contact pad disposed on the substrate surface, the contact pad electrically connected to at least one of the one or more connection posts of one of the one or more electronic components and the notch conductor of each corresponding notch.

In certain embodiments, each of the one or more connection posts has a diameter that is substantially the same as a width of the opening of the corresponding notch. In certain embodiments, the corresponding notch for each of the one or more connection posts is shaped to hold the connection post in place.

In certain embodiments, for each of the one or more notches of each of the one or more interconnect structures, (i) the notch extends only partially through the interconnect structure that comprises the notch in a direction parallel to the substrate surface, (ii) the notch has a wide end that is wider and closer to the edge of the interconnect structure than an opposing narrow end in a direction parallel to the substrate surface, the narrow end extending into the interconnect structure that comprises the notch and having a width that is substantially the same as or less than a diameter of the connection post that corresponds to the notch.

In certain embodiments, the transfer print structure comprises a contact pad for each of the one or more notches of each of the one or more interconnect structures, wherein the contact pad is disposed on the substrate surface at least partially within the notch, is electrically connected to the notch conductor of the notch, and is in direct physical contact with the connection post that corresponds to the notch.

In certain embodiments, each of the one or more connection posts comprises a bulb disposed at a distal end of the connection post that has a diameter that is greater than a diameter of the connection post between the bulb and a proximal end of the connection post.

In certain embodiments, for each of the one or more electronic components, each connection post comprises an L shape with a portion extending away from and substantially orthogonal to a substrate of the electronic component and a portion extending substantially parallel to the substrate.

In certain embodiments, at least one of the one or more interconnect structures forms a rail (e.g., wherein the at least one interconnect structure comprises two notches that each define portions of the rail) and at least one of the one or more electronic components comprises connection posts that form a socket with a socket opening and at least one of the rail and the socket opening is wedge shaped.

In certain embodiments, each of the one or more notches of each of the one or more interconnect structures is disposed at least partially between at least a portion of the interconnect structure comprising the notch and the substrate surface.

In certain embodiments, at least one of the one or more interconnect structures forms a rail (e.g., wherein the at least one interconnect structure comprises two notches that each define portions of the rail).

In some aspects, the present disclosure provides a method of making a transfer print system, comprising: providing a transfer print structure comprising: a destination substrate having a substrate surface and one or more substrate conductors disposed on or in the destination substrate, and one or more interconnect structures disposed on and protruding from the destination substrate in a direction orthogonal to the substrate surface, each interconnect structure comprising one or more notches, each notch (i) having an opening on an edge of the interconnect structure and extending at least partially through the interconnect structure in a direction parallel to the substrate surface from the edge of the interconnect structure, (ii) comprising a notch conductor disposed at least partially in the notch and (iii) electrically connected to at least one of the one or more substrate conductors; providing one or more electronic components on a source wafer, each electronic component comprising one or more electrically conductive connection posts; providing a micro-transfer printing stamp; contacting the one or more electronic components with the stamp to remove the one or more electronic components from the source wafer and adhere the one or more electronic components to the stamp; and transporting the one or more electronic components to the destination substrate and laterally moving the one or more electronic components over the substrate surface to electrically contact each connection post of the one or more connection posts of each of the one or more electronic components to the notch conductor of a corresponding notch of the one or more notches.

In certain embodiments, for each notch of the one or more notches of each of the one or more interconnect structures, (i) the notch extends only partially through the interconnect structure that comprises the notch in a direction parallel to the substrate surface, (ii) the notch has a wide end that is wider and closer to the edge of the interconnect structure than an opposing narrow end in a direction parallel to the substrate surface, the narrow end extending into the interconnect structure that comprises the notch and having a width that is substantially the same as or less than the diameter of the corresponding connection post, and the method comprises: laterally moving the one or more electronic components so that each connection post of the one or more electronic components is substantially in contact with the narrower end of a corresponding notch.

In certain embodiments, the transfer print structure comprises a contact pad disposed on the substrate surface at least partially within one of the one or more notches, the contact pad electrically connected to the notch conductor and the method comprises: moving one of the one or more electronic components into direct physical contact with the contact pad.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A and 2B are plan views of transfer print structures according to illustrative embodiments of the present disclosure;

FIGS. 6A and 6B are cross sections of a transfer printable electronic component before (FIG. 6A) and after (FIG. 6B) micro-transfer printing according to illustrative embodiments of the present disclosure;

FIG. 7A shows a micro-transfer print structure, FIG. 7B shows an electronic component with connection posts, and FIG. 7C shows the electronic component with connection posts micro-transfer printed into the interconnect structure (7B and 7C are upside down with respect to FIG. 7A for clarity);

Figure 1A:
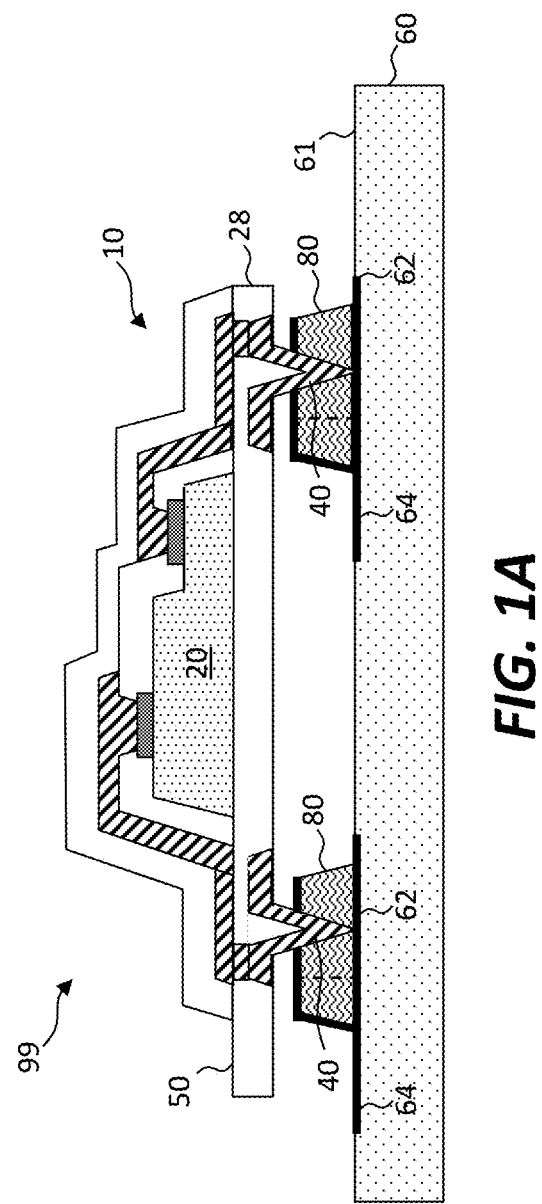
FIG. 1A is a cross section of a transfer print structure according to illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

For certain systems, it can be difficult to form a continuous conductor from a destination substrate to a small integrated circuit because of differences in height over the surface between the small integrated circuit and the destination substrate. The present disclosure provides structures and methods for electrically connecting relatively small electronic devices such as integrated circuit chiplets or light-emitting diodes (LEDs) to a relatively large destination substrate in an efficient and cost-effective way and with fewer processing steps.

Each micro-transfer printable electronic component can include a single integrated circuit, for example a digital circuit, an LED, a photo-diode, or a photo-transistor. In some embodiments, a micro-transfer printable electronic component includes a circuit on a component substrate, the circuit having multiple integrated circuits or other electronic or opto-electronic elements as well as electrically conductive wires interconnecting the multiple electronic elements to form the circuit. In some embodiments, an electronic component can receive, process, or provide electronic signals (or any combination thereof). In some embodiments, an electronic component includes one or more electronic devices that have other modalities, such as optical elements, magnetic elements, electrical field elements, emission elements, piezo elements, or sensing elements. For clarity and simplicity, the Figures illustrate an LED as an electronic device of an electronic component as a non-limiting example and, generally, the LED in the Figures can represent any electronic device.

Figure 1B:
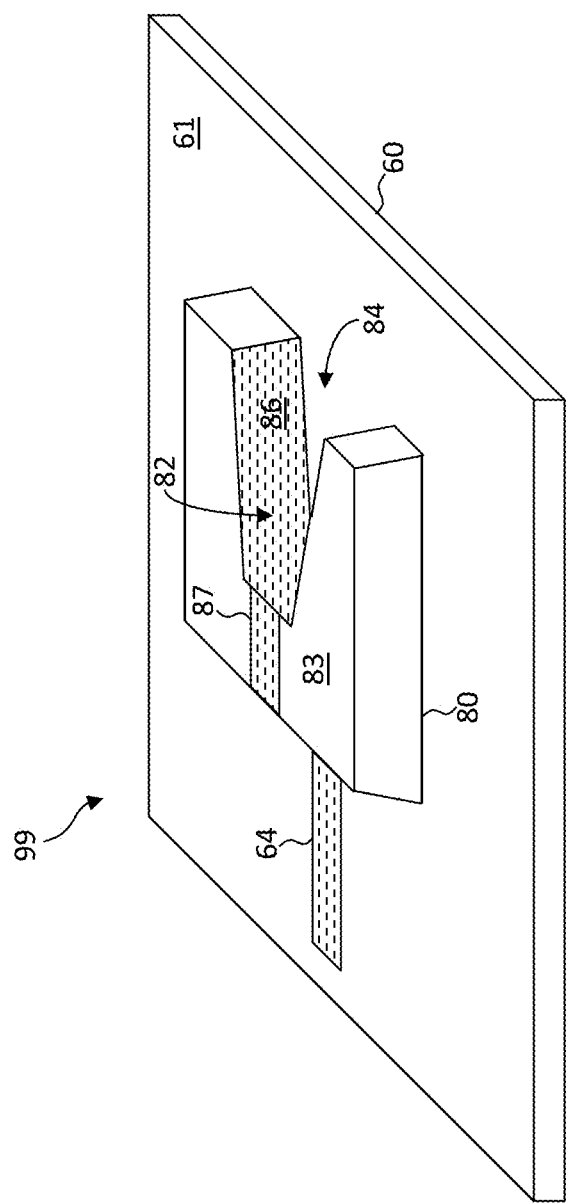
FIG. 1B is a partial perspective of the transfer print structure shown in FIG. 1A.
Figure 1C:
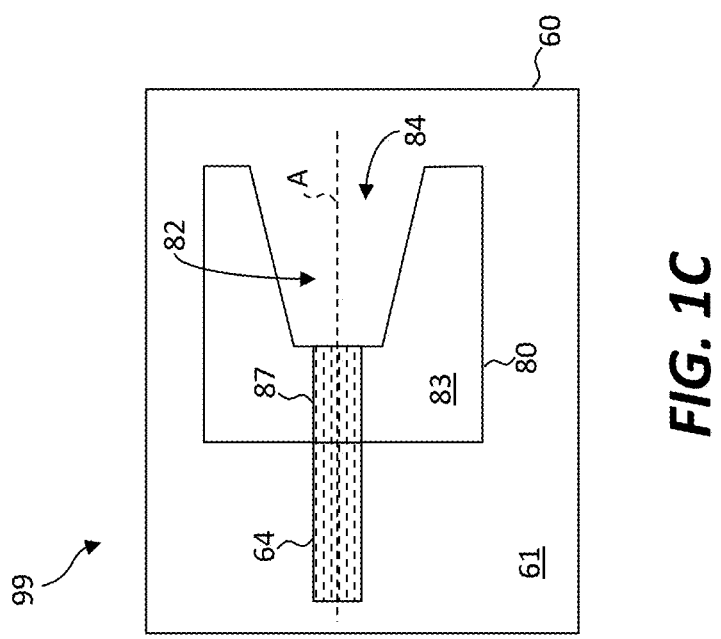
FIG. 1C is a plan view of the partial perspective of FIG. 1B.

Referring to the cross section of FIG. 1A, the corresponding partial perspective of FIG. 1B, and the corresponding partial plan view of FIG. 1C, indicating the cross section line A for FIG. 1A, a micro-transfer print structure 99 comprises a destination substrate 60 having a substrate surface 61 and one or more substrate conductors 64 disposed on or in the destination substrate 60 or substrate surface 61. One or more interconnect structures 80 are disposed on and protrude from the destination substrate 60 in a direction orthogonal to the substrate surface 61. FIG. 1A shows two interconnect structures 80 and FIGS. 1B and 1C each show only one interconnect structure 80. Each interconnect structure 80 comprises one or more notches 82, each notch 82 having an opening 84 extending at least partially in a direction parallel to the substrate surface 61 to an edge of the interconnect structure 80 and each notch 82 comprising a notch conductor 86 disposed at least partially in the notch 82 and electrically connected to one of the substrate conductors 64.

In some embodiments, an interconnect structure 80 comprises a dielectric layer 83 or dielectric structure and an electrical conductor layer 87 disposed at least partly on the dielectric layer 83, the electrical conductor layer 87 forming at least a part of the notch conductor 86. In some embodiments, an interconnect structure 80 is a metal structure or metal oxide structure that is electrically conductive so that the notch conductor 86 is a portion of the interconnect structure 80. A notch conductor 86 can comprise a metal or a metal oxide, for example either as an electrical conductor layer 87 or as a part of the interconnect structure 80.

In some embodiments, and as shown in FIGS. 1B and 1C and also FIGS. 2A and 2B, a notch 82 extends only partially through an interconnect structure 80 in a direction parallel to the substrate surface 61. A notch 82 can have opposing ends and one end can be wider than the other end in a direction parallel to the substrate surface 61 (as shown in FIGS. 1B, 1C, 2A, 2B). Referring to FIG. 2B, in some embodiments, a notch 82 has opposing ends and a mid-portion or neck 88 of the notch 82 between the ends is narrower than portions of the notch 82 to either side of the mid-portion or neck 88 in a direction parallel to the substrate surface 61.

Figure 1D:
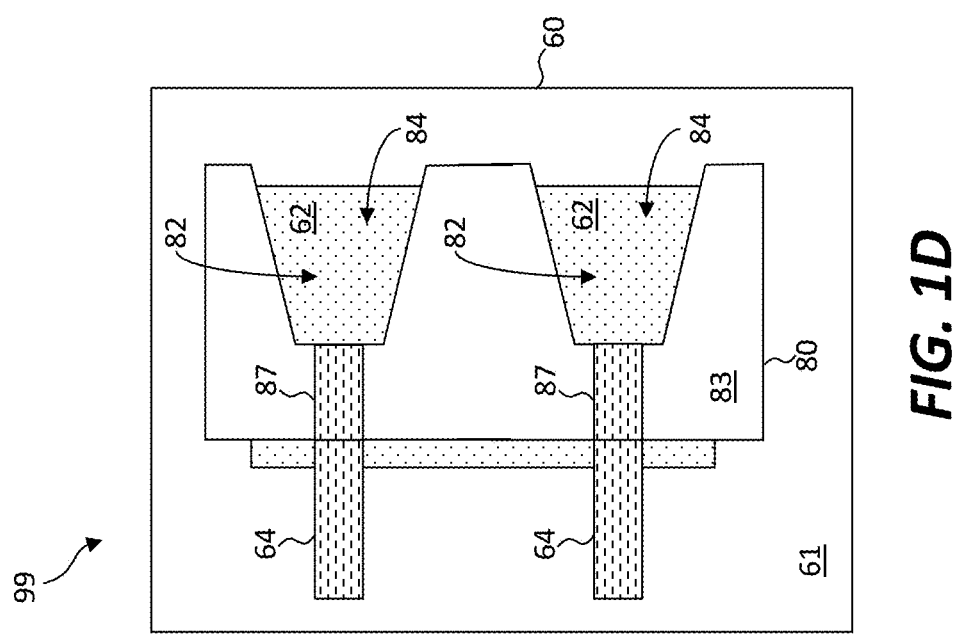
FIG. 1D is a plan view of a transfer print structure comprising two notches according to illustrative embodiments of the present disclosure.

Referring to FIG. 1D, in some embodiments, one interconnect structure 80 comprises two notches 82, and notch conductors 86 of the two notches 82 are electrically separate. In some embodiments, and as shown in the micro-graphs described subsequently, notch conductors 86 of two notches 82 are electrically connected. In some embodiments, a micro-transfer print structure 99 comprises a contact pad 62 disposed on the substrate surface 61 electrically connected to the notch conductor 86 (as shown in FIGS. 1A, 1D). In some embodiments, a contact pad 62 is at least partially in (e.g., beneath) a notch 82, on a substrate surface 61 beneath an interconnect structure 80, or between an interconnect structure 80 and a destination substrate 60.

Figure 3A:
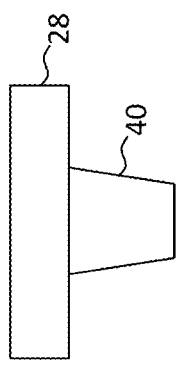
FIGS. 3A, 3B, and 3C are cross sections of connection posts according to illustrative embodiments of the present disclosure.
Figure 3B:
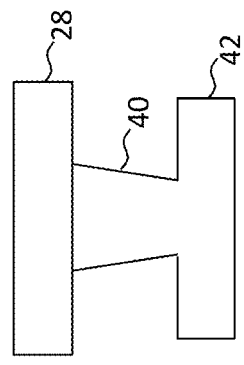
Figure 4:
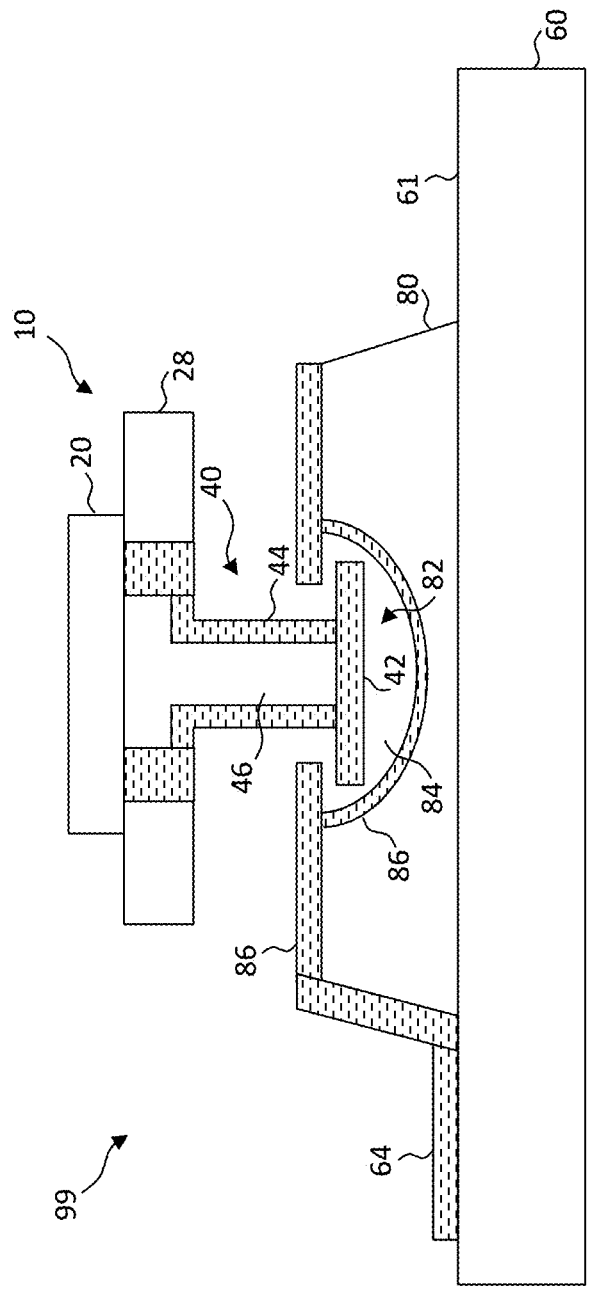
FIG. 4 is a cross section of a transfer print structure another illustrative embodiments of the present disclosure.

Referring to FIGS. 1A, 3A, 3B, and 4, in some embodiments, a micro-transfer print structure 99 comprises one or more electronic components 10. Each electronic component 10 comprises one or more electrically conductive connection posts 40 in electrical contact with a corresponding notch conductor 86. In some embodiments, a contact pad 62 is in direct physical contact with a corresponding connection post 40. In some embodiments, an electronic component 10 comprises a component substrate 28 having one or more electronic devices 20 disposed on the component substrate 28 and at least one of the electronic devices 20 is electrically connected to a connection post 40, for example through electrodes 30. A connection post 40 can have a diameter that is substantially the same as a width of an opening 84 of a notch 82 (e.g., no more than 20% larger or smaller, no more than 10% larger or smaller, no more than 8% larger or smaller, no more than 5% larger or smaller, or no more than 3% larger or smaller). In some embodiments, a notch 82 is sized to hold a connection post 40 is in place. Thus, in some embodiments, a notch 82 of an interconnect structure 80 mechanically holds an electronic component 10 in place and form an electrical connection through a connection post 40 of the electronic component 10 between an electronic device 20 of the electronic component 10 and a substrate conductor 64 of a destination substrate 60. Referring specifically to FIG. 4, in some embodiments, a connection post 40 can have a layered core structure, for example a dielectric layer 46 core coated with an electrical conduction layer 44 that can form a part of or electrically connect to an electrode 30.

Figure 3C:
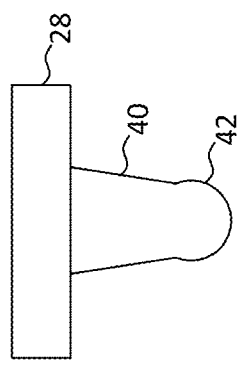

In some embodiments, a notch 82 extends only partially through an interconnect structure 80 in a direction parallel to a substrate surface 61. In some embodiments, a notch 82 has a wide end that is wider than an opposing narrow end in a direction parallel to the substrate surface 61. The narrow end extends into the interconnect structure 80 and has a width that is substantially the same as or less than the diameter of a corresponding connection post 40. In some embodiments, as shown in FIG. 4, a notch 82 has a slot portion adjacent to a substrate surface 61 that is wider than a portion of the notch 82 on a side of the slot portion opposite the substrate surface 61 in a direction orthogonal to the substrate surface 61. As shown in FIGS. 3B, 3C, and 4, a connection post 40 can have a bulb 42 on the distal end of the connection post 40 that has a diameter that is greater than a diameter of the connection post 40 between the bulb 42 and the proximal end of the connection post 40. A bulb 42 can help to prevent the removal of an electronic component 10 from an interconnect structure 80 of a destination substrate 60 in a direction orthogonal to a substrate surface 61, as shown in FIG. 4. (In FIG. 4, for clarity of illustration the connection post 40 is illustrated spaced apart from the notch conductor 86. In an actual implementation, the electrical conduction layer 44 of the connection post 40 is in electrical and physical contact with the notch conductor 86.)

Figure 5:
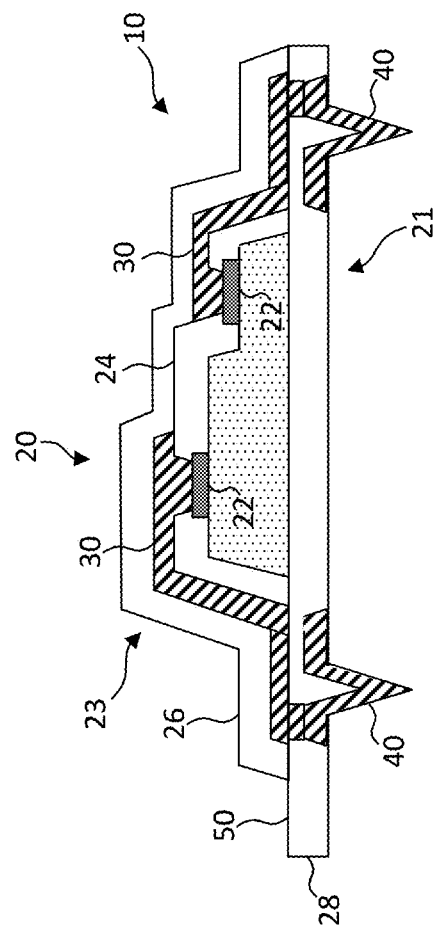
FIG. 5 is a cross section of a transfer printable electronic component or electronic device according to illustrative embodiments of the present disclosure.

Referring to FIG. 5, an electronic component 10 can include an electronic device 20 disposed on a component substrate 28 (for example a dielectric layer) with connection posts 40 electrically connected to electrical contacts 22 on the electronic device 20 through electrodes 30 insulated from semiconductor material by dielectric structures 24 and encapsulated with an encapsulation layer 26. In some embodiments, an electronic component 10 is a semiconductor component, an integrated circuit, a CMOS circuit, a compound semiconductor component, or an LED.

Figure 6A:
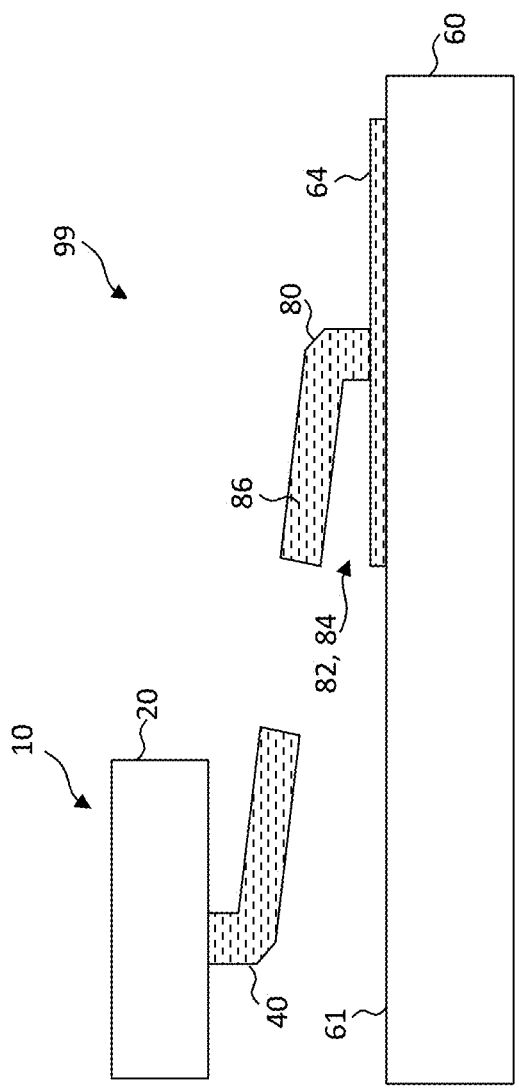

In some embodiments, referring to FIGS. 6A and 6B, an interconnect structure 80 and a connection post 40 have complementary 'L' shapes that fit together. Accordingly, the interconnect structure 80 comprises an 'L' shape with a portion extending orthogonally away from the substrate surface 61 of the destination substrate 60 on which the interconnect structure 80 is disposed and a portion extending horizontally to the substrate surface 61, leaving a gap (the notch 82 with opening 84) between the horizontal portion of the interconnect structure 80 and the substrate surface 61. The connection post 40 comprises an 'L' shape inverted from the 'L' shape of the interconnect structure 80 with a portion extending away from and substantially orthogonal to a substrate of the electronic device 20 and a portion extending substantially parallel to the substrate, leaving a gap between the horizontal portion of the connection post 40 and the body of the electronic component 20. As used herein, a portion of an L shape extending substantially orthogonal to a substrate means that the portion extends away from the substrate in a direction that is within some range relative to orthogonal (e.g., within ±30 degrees, ±20 degrees, ±10 degrees, or ±5 degrees to orthogonal). As used herein, a portion of an L shape extending substantially parallel to a substrate means that the portion extends in a direction that is within some range relative to parallel (e.g., within ±30 degrees, ±20 degrees, ±10 degrees, or ±5 degrees to parallel). A connection post 40 or an interconnect structure 80 can be metal or have a dielectric core with a metal or other electrically conductive coating forming the electrical conductor 44 and the notch conductor 86, respectively. As shown in FIG. 6B, the electronic component 10 is moved laterally horizontally with respect to the substrate surface 61 to interlock the interconnect structure 80 and the connection post 40 so that the opening 84 of the interconnect structure 80 is at least partially filled with the horizontal portion of the connection post 40, electrically connecting the electrical conduction layer 44 of the connection post 40 and the notch conductor 86 and optionally the substrate conductor 64.

Figure 7B:
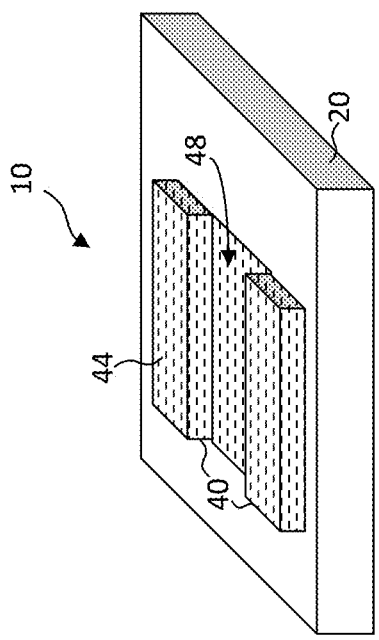
FIGS. 7A, 7B, and 7C are perspectives according to illustrative embodiments, where
Figure 7A:
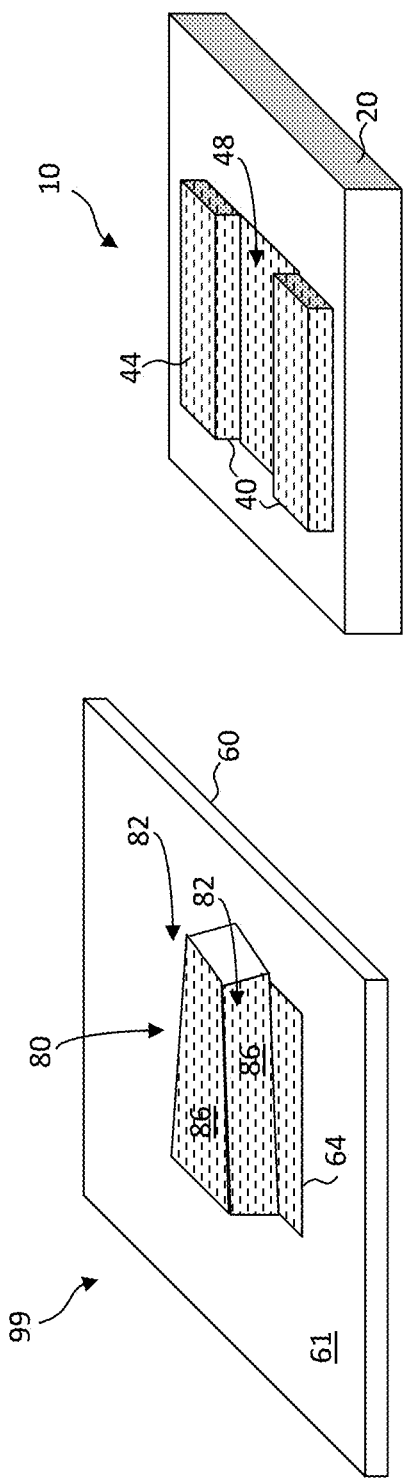
Figure 7C:
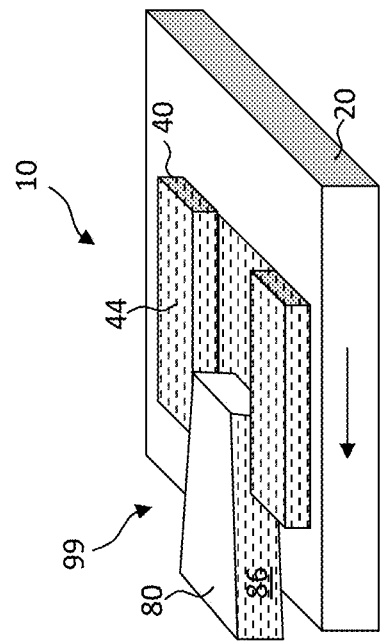

In some embodiments, referring to FIGS. 7A, 7B, and 7C, an interconnect structure 80 protrudes from the substrate surface 61 of a destination substrate 60 and two notches 82 with openings 84 are on either side of the interconnect structure 80 with the notches 82 extending fully along the interconnect structure 80 in a direction parallel to the substrate surface 61 such that the interconnect structure forms a rail (as shown in FIG. 7A). In some embodiments, a portion of a common notch conductor is disposed in each of two or more notches in an interconnect structure (e.g., wherein a portion of the common notch conductor is also disposed on or in the interconnect structure such that the portions in each of the two or more notches are electrically connected). Referring to FIG. 7B, the electronic component 10 is shown upside down with respect to the illustration of FIG. 7A and comprises the electronic device 20 with a connection post 40 in the form of a socket having at least one open end and opposing portions protruding from a surface of the electronic component 20 separated by a space between the protrusions forming a socket opening 48. Protrusions forming a connection post 40 and the surface of an electronic component 20 between the protrusions can be a metal or a dielectric structure coated with a metal or other electrically conductive material forming an electrical conduction layer 44. Referring to FIG. 7C (also upside down with respect to the illustration of FIG. 7A), the electronic component 10 is micro-transfer printed in a direction horizontally lateral to the destination substrate 60 surface 61 (not shown in FIG. 7C) so that the rail is disposed between the protrusions of the connection post 40. The positions of the notches 82 and openings 84 of the notches 82 then correspond to the location of the connection post 40 protrusions. A substrate conductor 64 can extend over the substrate surface 61 in the notches 82 to contact the electrical conduction layer 44 on top of the connection post 40 and the electrical conduction layer 44 of the connection post 40 can extend between the connection post 40 protrusions and contact the notch conductors 86 and portion of the substrate conductor 64 on the top of the interconnect structure 80.

To facilitate moving a connection post 40 into position with an interconnect structure 80 that forms a rail and forming a robust physical and electrical connection between notch conductors 86 of the interconnect structure 80 and electrical conduction layers 44 of the connection post 40, at least one of the rail and the socket opening 48 can be wedge shaped so that the distance between the connection post 40 protrusions is greater at one end than the width of the rail but not at the other end. As shown in FIGS. 7A and 7C, the rail of the interconnect structure 80 can be wedge shaped. As intended herein, a wedge shape only requires that one end of the shape is wider than another end. Thus, objects having a triangular, trapezoidal, half-circular, or half-elliptical cross section parallel to a substrate surface 61 can be wedges. Hence, although the rail of the interconnect structure 80 shown in FIG. 7A has straight, largely planar, quadrilateral or rectangular sides, other shapes, including structures with circular or elliptical cross sections are possible and are used in some embodiments. The wedge shape of either the socket opening 48 or the rail does not have to have straight, planar, or quadrilateral sides. In some embodiments, both the socket opening 48 and the rail are wedge shaped.

Figure 8:
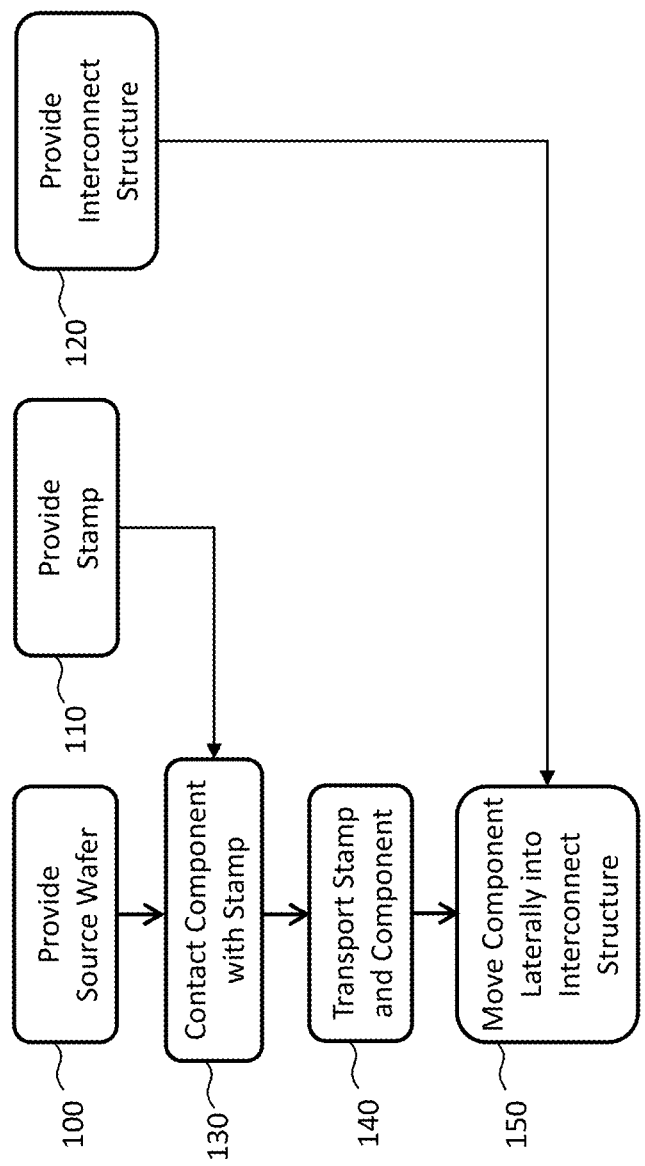
FIG. 8 is a flow chart of an exemplary method according to illustrative embodiments of the present disclosure.

Referring to the flow diagram of FIG. 8, a method of making a micro-transfer print structure 99 comprises providing a source wafer of electronic components 10 in step 100, each electronic component 10 comprising one or more electrically conductive connection posts 40, providing a micro-transfer print stamp in step 110, and providing a micro-transfer print structure 99 in step 120. In step 130, the electronic component is contacted with the stamp to remove the electronic component 10 from the source wafer and adhere the electronic component 10 to the stamp. The electronic component 10 is transported in step 140 to a destination substrate 60 and laterally moved over the substrate surface 61 in step 150 to electrically contact connection posts 40 of the electronic component 10 to notch conductors 86 of notches 82 in one or more interconnect structures 80 disposed on the destination substrate 60. In some embodiments, each connection post 40 in an electronic component 10 is electrically contacted to a notch conductor 86 of a notch 82. In some embodiments, one or more connection posts 40 of an electronic component 10 are not electrically contacted to notch conductors 86 while one or more connection posts 40 of the electronic component 10 are electrically contacted to notch conductors 86. In some embodiments, a transfer device that is not a stamp (e.g., an electrostatic-based or vacuum-based transfer device) is used to transfer an electronic component 10 instead of a stamp.

As used herein, moving "laterally" means moving in a direction that is substantially parallel to a surface (e.g., substrate surface 61). In some embodiments, lateral motion occurs simultaneously with vertical motion in a compound motion. In some embodiments, lateral motion occurs without vertical motion (i.e., motion is only substantially parallel to a surface during the lateral motion).

In some embodiments, a notch 82 extends only partially through an interconnect structure 80 in a direction parallel to the substrate surface 61, the notch 82 has opposing ends, one end is narrower than the other end in a direction parallel to the substrate surface 61, the narrower end extends into the interconnect structure 80 and has a width that is substantially the same as or less than the diameter of a corresponding connection post 40. The electronic component 10 comprising the corresponding connection post 40 is laterally moved into contact with the interconnect structure 80 so that the connection post 40 is substantially in contact with the narrower end of the notch 82. If a contact pad 62 electrically connected to the notch conductor 86 is disposed on the substrate surface 61 beneath the notch 82, the connection post 40 of the electronic component 10 can be moved into direct physical contact with the contact pad 62. In some embodiments, a connection post 40 can be mechanically wedged into a notch 82 of an interconnect structure 80 and, optionally, welded to a notch conductor 86 of the notch 82.

Referring again to FIGS. 1 and 5, in some embodiments, a printable electronic component 10 includes one or more electronic devices 20 (e.g., LEDs, control circuits, piezoelectric devices) disposed in contact with a component substrate 28, for example a dielectric substrate, that can serve as a substrate to the electronic component 10 or electronic device 20. Each electronic device 20 has one or more device electrical contacts 22 for providing electrical power to the electronic device 20. The electronic component 10 has a post side 21 that can be a surface and an opposing stamp side 23 that can also be a surface. A plurality of electrodes 30 (electrical conductors) are included in the printable electronic component 10 and at least one electrode 30 is electrically connected to each of the device electrical contacts 22.

One or more electrically conductive connection posts 40 protrude from the component substrate 28 in a direction opposite to the stamp side 23 of the electronic device 20 (i.e., in the direction of the post side 21). Each connection post 40 is electrically connected to at least one of the electrodes 30. Each connection post 40 can be electrically connected to an electrode 30 or can include an electrode 30. In some embodiments, each device electrical contact 22 is electrically connected to a connection post 40. An adhesive can adhere an electronic component 10 to a destination substrate 60 and connection posts 40 can be in direct physical and electrical contact with contact pads 62 on the destination substrate 60 (if present). In some embodiments, an adhesive can be deposited in drops with an inkjet deposition device or as a layer over a destination substrate 60.

An interconnect structure 80 can be made using a variety of photolithographic methods and materials. For example, a dielectric material can be deposited, for example by coating over the destination substrate 60 and patterned to form a dielectric layer 83 structure. A conductive material, such as a metal, can be deposited, for example by evaporation or sputtering, over the destination substrate 60 and patterned to form an electrical conductor layer 87 structure. Contact pads 62 can be formed in the same process steps and with the same materials.

Figure 11:
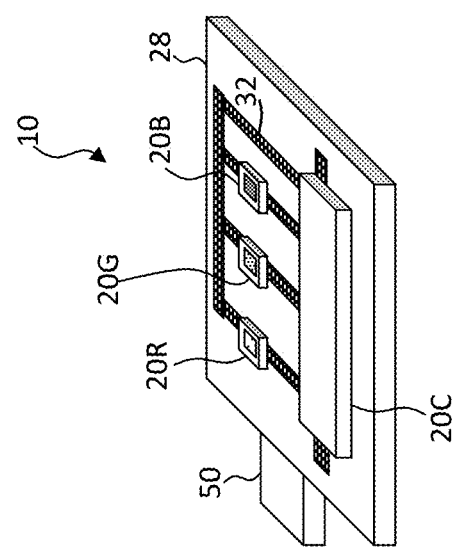
FIG. 11 is a perspective illustration of a micro-transfer printable electronic component according to illustrative embodiments of the present disclosure.

In various embodiments, an electronic device 20 is an inorganic micro-light-emitting diode (LED) including semiconductor or compound semiconductor LED material such as GaN and can emit any of a variety of different colored lights. A semiconductor or compound semiconductor LED material can be crystalline or partially crystalline. An LED can include multiple layers of different materials, for example conductive layers, emission layers, doped layers, or undoped layers that enable the LED to emit light when provided with electrical power through device electrical contacts 22. LEDs can be made using integrated circuit processes, tools, and materials. In some embodiments, an electronic device 20 is a CMOS integrated circuit made in a silicon semiconductor or is a circuit comprising multiple integrated circuits or electronic elements and can include conductive wires 32 (e.g., as shown in FIG. 11 and described subsequently) electrically connecting the electronic devices 20 and any other electronic component 10 elements.

Device electrical contacts 22 can be designated portions of an electronic device material or can be electrical contact pads 62 in contact with designated portions of the electronic device material. For example, device electrical contacts 22 can be a metal, such as aluminum, silver, gold, tantalum, tungsten, titanium, or tin, or a metal alloy. Device electrical contacts 22 can be located on a common side of the electronic device 20 and light can be emitted from a light-emitting electronic device 20 (e.g., LED) in a direction opposite the common side on which the device electrical contacts 22 are formed. In some embodiments, the common side on which the device electrical contacts 22 are located is the stamp side 23 opposite the post side 21, as shown in FIG. 5. In some embodiments, the common side on which the device electrical contacts 22 are located is the post side 21 (not shown). A stamp side 23 is one adapted for adhesion to a transfer device (e.g., stamp), such as an elastomeric (e.g., PDMS) stamp, or a stamp pillar (e.g., of a stamp), and can be contacted by the stamp to micro-transfer print the electronic component 10. In some embodiments, an electronic device 20 includes a bare die and the stamp side 23 of the electronic component 10 on which the electronic device 20 is disposed is exposed to the environment and is not enclosed in a package. In contrast, most integrated circuits are packaged in plastic or ceramic containers and the IC die is not exposed to the environment. Referring to FIGS. 1 and 5, the electronic component 10 is unpackaged and exposed to the environment, since the encapsulation layer 26 is a part of the electronic component 10, and the electronic device 20 is a bare die and is also not packaged. Device electrical contacts 22 can be formed using photolithographic methods known in the integrated circuit arts. Electrical contacts 22 can be electrically connected to a power source to provide electrical power to an electronic device 20, for example to emit light.

Electrodes 30 can be a metal, such as aluminum, silver, gold, tantalum, tungsten, titanium, or tin, or a metal alloy and can be patterned to form electrical conductors or electrical traces that conduct electricity to device electrical contacts 22. Electrodes 30 can be deposited and patterned using photolithographic methods known in the integrated circuit arts, for example, using sputtering or evaporation with patterned etching. Patterned dielectric structures 24 can be formed before electrodes 30 are deposited and patterned to electrically insulate portions of an electronic device 20 and control the flow of electrical current through the electronic device 20. Patterned dielectric structures 24 can be, for example, silicon dioxide, silicon nitride, or other insulators that can be patterned using photolithographic methods.

The electrically conductive connection posts 40 that protrude from a component substrate 28 can be, but are not necessarily, the same material and can be, but are not necessarily, made in a common step with electrodes 30. Electrically conductive connection posts 40 can be a spike with a sharp point. In some embodiments, connection posts 40 are a portion of electrodes 30. Connection posts 40 protrude and extend beyond a component substrate 28 of an electronic component 10, for example, in a direction orthogonal to a surface of the post side 21 and away from the stamp side 23, so that if the printable electronic component 10 is pressed against a surface, such as a destination substrate 60, with the post side 21 adjacent to the destination substrate 60, the connection posts 40 will contact the surface of the destination substrate 60 before the electronic component 10 component substrate 28, for example at contact pads 62. If a printable electronic component 10 is forcefully pressed against a substrate surface 61, connection posts 40 can be in contact with, embedded in, or pierce the substrate surface 61. For example, if the substrate surface 61 includes electrical contact pads 62 on a destination substrate 60 (or other substrate), the connection posts 40 can form a mechanically robust electrical connection between the electrodes 30 (electrical conductors) and the destination substrate electrical contact pads 62.

Electrodes 30 can provide rigidity and mechanical strength to a printable electronic component 10 so that the printable electronic component 10 can be micro-transfer printed and connection posts 40 of the printable electronic component 10 pressed into or against a notch conductor 86 or an electrical contact pad 62 on a destination substrate 60 to form a robust electrical connection without harming the electronic component 10 or the electrodes 30 or causing them to cease proper function. In some embodiments, an encapsulation layer 26 provides environmental protection and additional mechanical strength to a printable electronic component 10 as well as forming a core structure for connection posts 40. An encapsulation layer 26 can be a dielectric layer and can be formed using dielectric materials (for example, silicon nitride or silicon dioxide) that are coated over a printable electronic component 10 and then patterned using photolithographic processes, such as using a photosensitive layer (e.g., photoresist) to form a patterned mask after light exposure and then etching the photosensitive layer and one or more layers beneath the photosensitive layer. Similar methods can be used to pattern dielectric structures 24 and electrodes 30.

Figure 9:
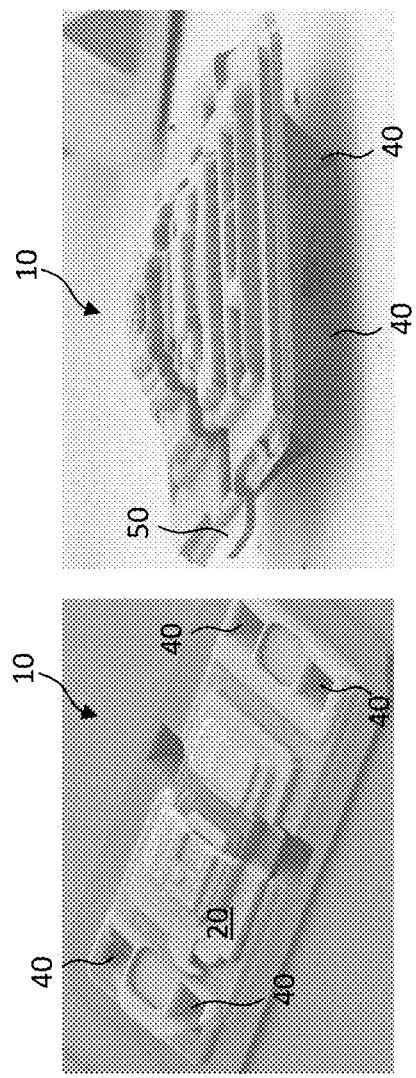
FIG. 9 are perspective micro-graphs of electronic components according to illustrative embodiments of the present disclosure.

FIG. 9 shows two micrographs of a printable electronic component 10 having an LED electronic device 20 constructed using the materials and methods described herein. The printable electronic component 10 has 4 connection posts 40, two for each electrode 30 located at either end of the printable electronic component 10. The two center posts are not electrically connected to the electronic device 20 and serve to enhance adhesion to an optional layer of adhesive. The printable electronic component 10 of FIG. 9 has been micro-transfer printed successfully to a substrate and successfully tested, demonstrating light emission when provided with electrical power.

Figure 10:
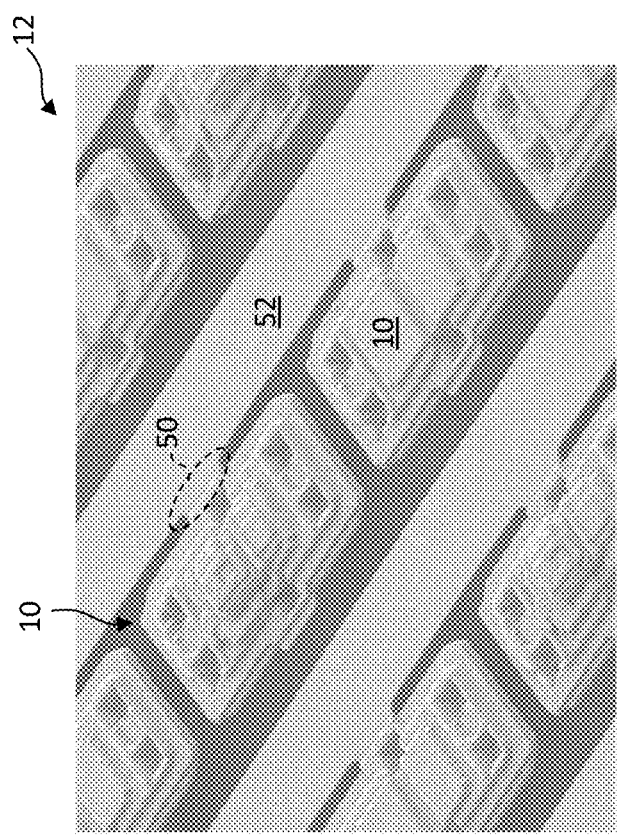
FIG. 10 is a perspective micro-graph of a source wafer according to illustrative embodiments of the present disclosure.

Referring to FIG. 10, in some embodiments, electronic components 10 are formed on a source wafer 12 with anchors 52 (e.g., portions of the source wafer) physically connected with tethers 50 to the electronic components 10 or electronic devices 20 disposed on the electronic components 10. FIG. 10 shows one tether 50 physically connecting each electronic component 10 to the source wafer 12, but, in some embodiments, one or more tethers 50 (e.g., two tethers) physically connect each electronic component 10 to one or more anchors 52 (e.g., each tether 50 connects the electronic component 10 to a unique anchor 52). In some embodiments, an etchable substrate (e.g., a semiconductor or sacrificial substrate) on a source wafer 12 is provided and depressions, for example pyramidal or rectangular depressions made in the etchable substrate. The depressions are patterned with an electrical conductor to form connection posts 40, a component substrate 28 (e.g., a dielectric layer) deposited on the etchable substrate, vias formed in the component substrate 28 and filled or coated with patterned metal. An electronic device 20 is formed, for example using photolithographic processes to create dielectric structures 24, electrically connect the electronic device 20 with electrical contacts 22 and electrodes 30, and protect the electronic device 20 with an encapsulation layer 26. The etchable substrate or sacrificial layer or sacrificial portion is removed leaving a tether 50 physically connecting the electronic component 10 to a source substrate.

A dielectric material can form a core for a connection posts 40, for example a dielectric core. Any one or more of a dielectric component substrate 28, dielectric structure 24, and encapsulation layer 26 can provide additional rigidity and mechanical strength to a printable electronic component 10 and connection posts 40 and can electrically insulate elements in contact with the dielectric component substrate 28, for example an electronic device 20 or electrodes 30, as shown. Thus, connection posts 40 can comprise an electrically conductive layer (e.g., a metal layer) formed over a core of a different material (e.g., a dielectric material) that protrudes through a dielectric component substrate 28.

A dielectric component substrate 28 can be substantially transparent to light emitted by a light-emitting electronic device 20 (e.g., an LED) and the light-emitting electronic device 20 can emit light through the dielectric component substrate 28. In some embodiments, a light-emitting electronic device 20 emits light in the same direction that connection posts 40 protrude. In some embodiments, the light-emitting electronic device 20 emits light in a direction opposite the dielectric component substrate 28 or opposite the direction that connection posts 40 protrude. By substantially transparent is meant that sufficient light is transmitted to enable adequate function in a desired system (e.g., at least 50% transparent, at least 60% transparent, at least 70% transparent, at least 80% transparent, at least 90% transparent, or at least 95% transparent).

As shown in FIG. 1A, in some embodiments, connection posts 40 of a printable electronic component 10 are in electrical contact with electrically conductive contact pads 62 and substrate conductors 64 on a destination substrate 60. Contact pads 62 and substrate conductors 64 can be electrical conductors, or portions of electrical conductors such as wires 32, traces or other electrically conductive elements on a destination substrate 60. Contact pads 62 and substrate conductors 64 can be metal, for example aluminum, silver, tin, or copper, or a metal alloy. Thus, in some embodiments, contact pads 62 and substrate conductors 64 are in electrical contact with electronic devices 20 and electronic devices 20 can be controlled by a controller (not shown in the Figures) on a destination substrate 60 that is electrically connected to the contact pads 62 and the substrate conductors 64. A destination substrate 60 can be a display substrate, can be a printed circuit board, or can be made of glass, polymer, metal, resin, or ceramic. In some embodiments, a destination substrate 60 is substantially transparent (e.g., at least 50%, at least 60%, at least 70%, at least 80%, at least 90%, or at least 95% transparent) and light is transmitted through the transparent destination substrate 60.

Referring to FIG. 11, in some embodiments, a printable electronic component 10 comprises a plurality of electronic devices 20, including a controller 20C, a red LED 20R, a green LED 20G, and a blue LED 20B. In these embodiments, the integrated circuit controller 20C chiplet is electrically connected to at least one connection post 40 and at least one device electrical contact 22. The integrated circuit controller 20C chiplet can control the other electronic devices 20 of the printable electronic component 10, for example the red, green, and blue LEDs 20R, 20G, 20B. As shown in FIG. 11, in some embodiments, a printable electronic component 10 includes a plurality of electronic devices 20 (e.g., the controller 20C, the red LED 20R emitting red light, the green LED 20G emitting green light, and the blue LED 20B emitting blue light, collectively LEDs 20). Each LED 20 has device electrical contacts 22 for providing electrical power to the LED 20. A printable electronic component 10 can be a full-color pixel in a display. Each LED 20 of the plurality of LEDs 20 has an electrical contact 22 that is electrically connected to an electrode 30. A connection post 40 can be common to two or more LEDs 20 and electrically connected to a common electrode 30. An electronic component 10 can be a micro-transfer printable component and have a tether 50. Electronic devices 20 (e.g., the controller 20C, the red LED 20R, the green LED 20G, and the blue LED 20B) can themselves also be micro-transfer printed onto a components substrate 28 and comprise a broken (e.g., fractured) or separated tether 50 (not shown in FIG. 11).

Figure 12A:
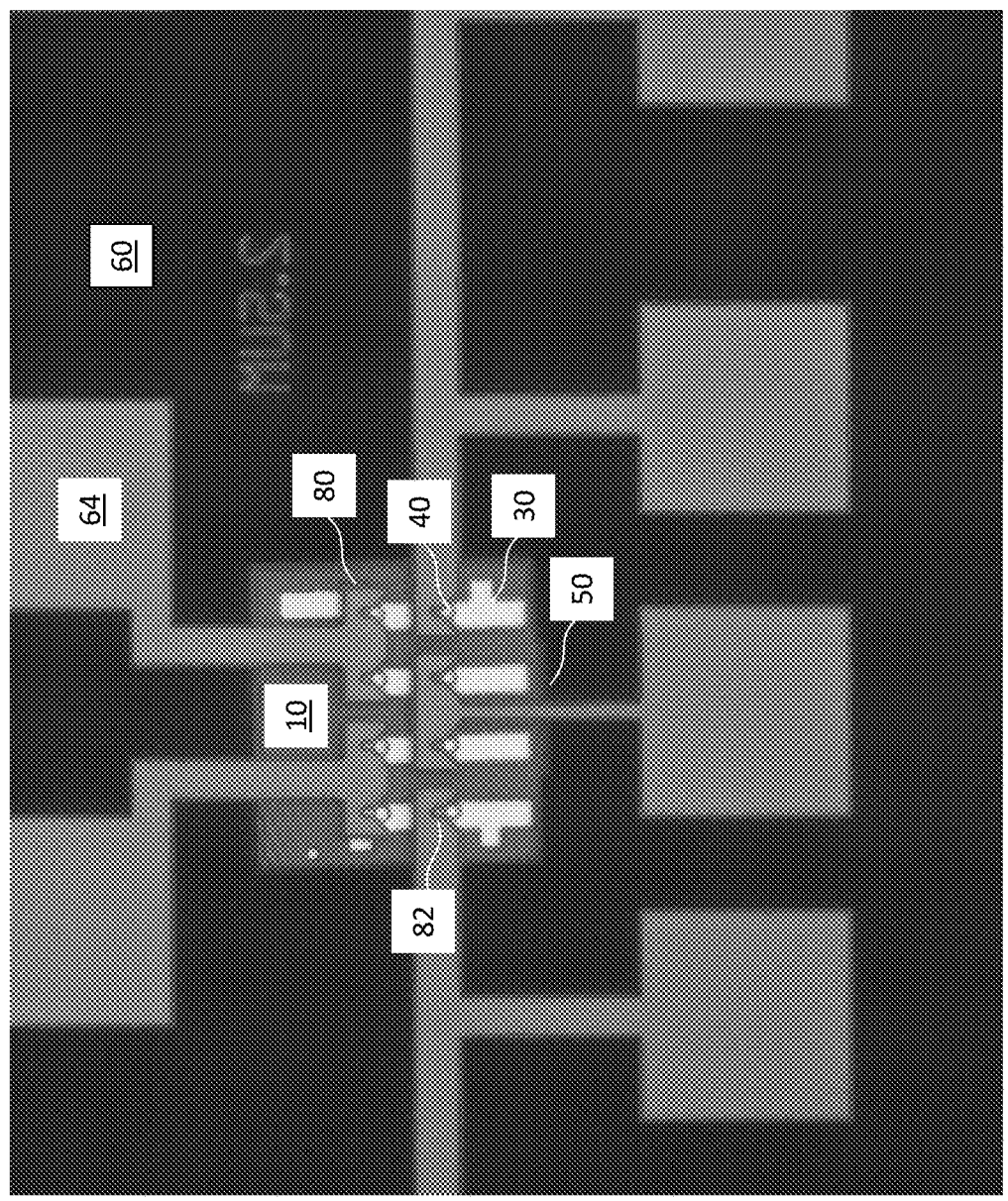
FIG. 12A is a bottom-side plan view micrograph of an electronic component and interconnect structure illustrating the process of interconnection according to illustrative embodiments of the present disclosure.
Figure 12B:
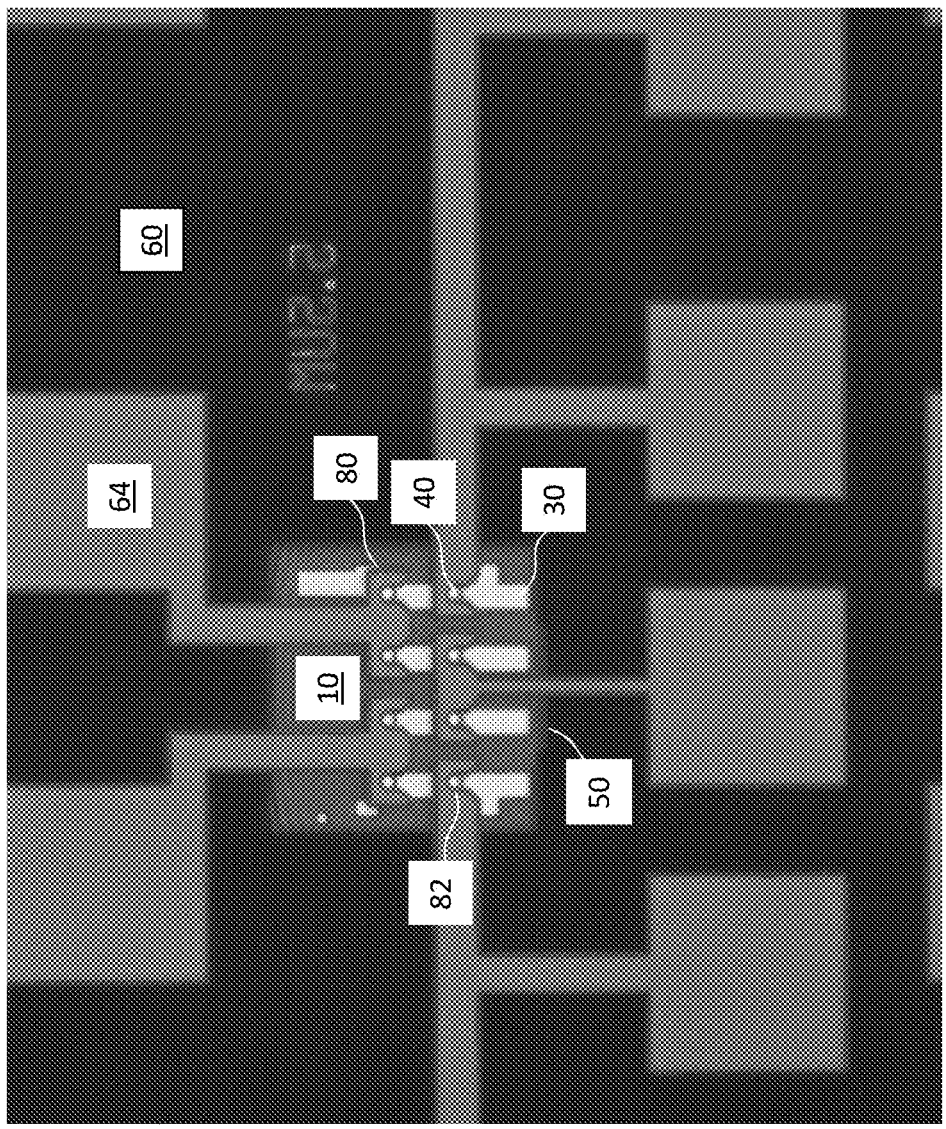
FIG. 12B is a bottom-side plan view micrograph of an electronic component and interconnect structure illustrating the interconnection according to illustrative embodiments of the present disclosure.
Figure 13:
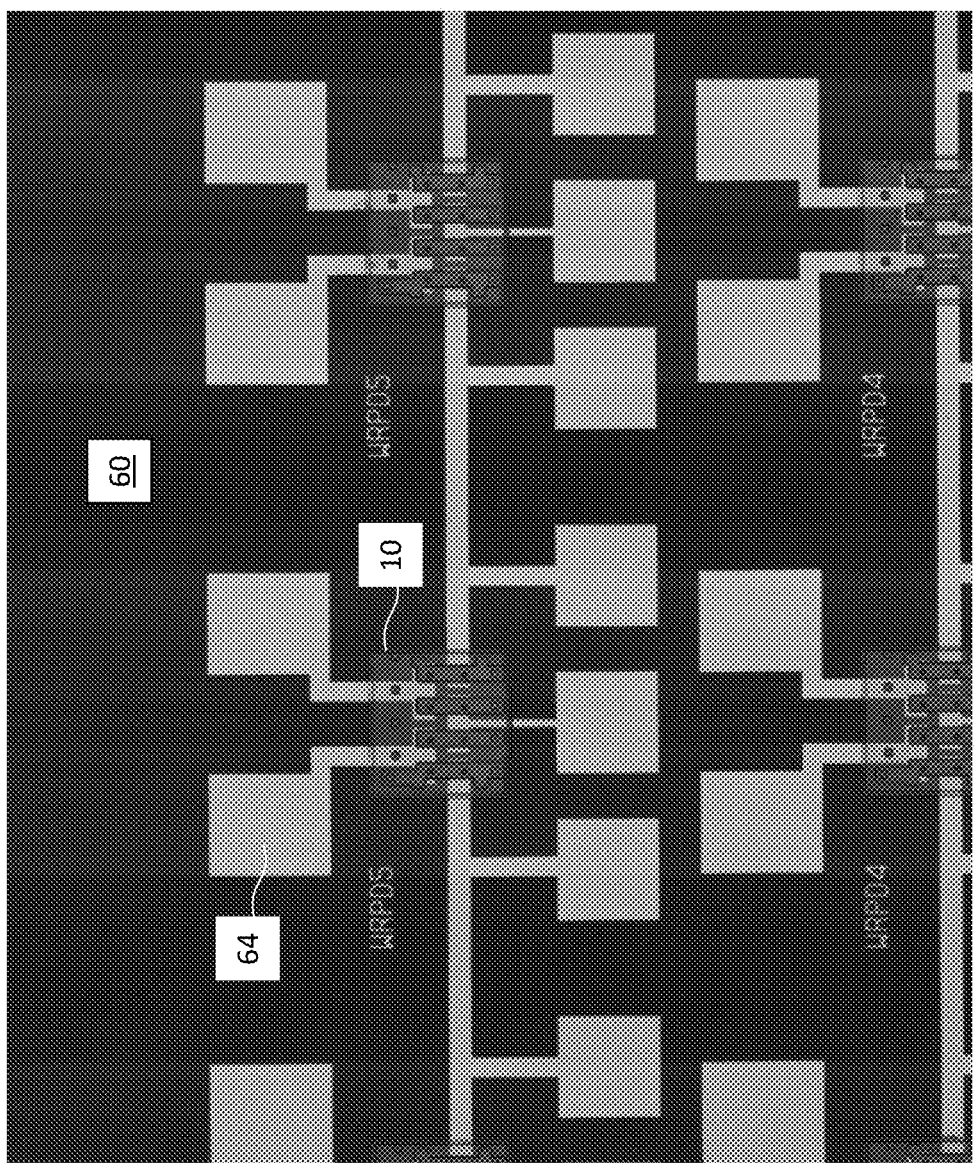
FIG. 13 is a top-side plan view micrograph of an electronic component and interconnect structure according to illustrative embodiments of the present disclosure.
Figure 14:
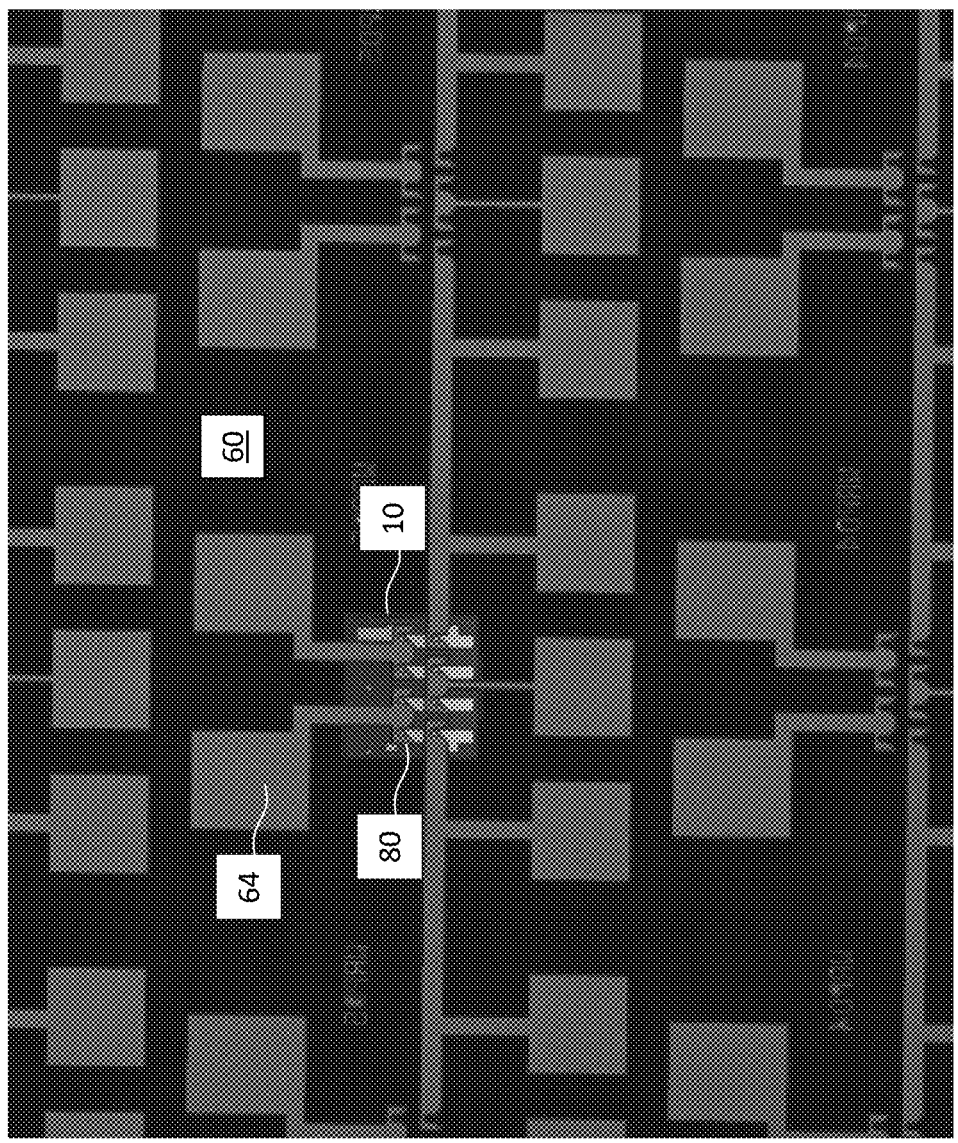
FIG. 14 is a bottom-side plan view micrograph of an electronic component and interconnect structure according to illustrative embodiments of the present disclosure.

Referring to the micrograph of FIG. 12A, printable electronic components 10 in accordance with the printable electronic component 10 shown in FIG. 5 are micro-transfer printed onto a destination substrate 60 in accordance with a method shown in FIG. 8, as illustrated in FIG. 1A but the connection posts 40 are not yet laterally inserted into notches 82. As shown in FIG. 12B, after lateral movement of the electronic component 10 (in accordance with FIG. 8 step 150), the connection posts 40 are firmly in place in the interconnect structures 80 and electrically connected to the notch conductors 86 and contact pads of the destination substrate 60. The micrographs of FIGS. 12A and 12B are taken through the destination substrate 60. FIGS. 13 and 14 are larger scale micrographs of micro-transfer printed electronic components 10 seen from the top (FIG. 13) and from the bottom through the destination substrate 60 (FIG. 14).

In various embodiments, printable electronic components 10 or electronic devices 20, or both, have at least one of a width, length, and height from 2 to 500 µm (e.g., 2 to 5 µm, 5 to 10 µm, 10 to 20 µm, 20 to 50 µm, 50 to 100 µm, 100 to 250 µm, or 250 to 500 µm).

A method of making a printable electronic component source wafer includes providing a source wafer 12 including wafer material, forming a patterned sacrificial layer having sacrificial portions spaced apart by anchors 52 formed on or in the source wafer 12, providing a plurality of electronic devices 20, each electronic device 20 disposed entirely over a sacrificial portion 54 and connected to at least one anchor 52 by at least one tether 50. In some embodiments, electronic devices 20 are micro-transfer printed on or over the sacrificial portions. In some embodiments, electronic devices 20 are formed on or over the sacrificial portions. A plurality of electronic devices 20 can be provided on each of the sacrificial portions. For example, red, green, and blue LEDs 20R, 20G, 20B can be micro-transfer printed from different wafers possibly made with different materials or crystalline structures (or the same wafer) onto the sacrificial portions or component substrates 28. A printable electronic component source wafer 12 can include a plurality of sacrificial portions with a corresponding plurality of printable electronic components 10 that can be assembled in a single process step by micro-transfer printing a plurality of the red, green, and blue LEDs 20R, 20G, 20B in a common step onto corresponding sacrificial portions or component substrates 28 so that each sacrificial portion or component substrate 28 has one each of a red, green, and blue LED 20R, 20G, 20B.

In some embodiments, a plurality of printable electronic components 10 or electronic devices 20 is provided in a source wafer 12 (as shown in FIG. 10) by first patterning a sacrificial layer in the source wafer 12 to form sacrificial portions separated by anchors 52 using photolithographic materials and methods. A source wafer 12 can comprise a substrate such as a semiconductor, glass, polymer, metal, or ceramic wafer. If a dielectric component substrate 28 is desired, it is then deposited (not shown), forming at least one tether 50 and patterned to form vias exposing the desired location of connection posts 40. Connection post forms are etched into the sacrificial portions, through the dielectric component substrate 28 (if present). Patterned metal is deposited in the connection post forms to form the connection posts 40 and the dielectric component substrate 28 deposited and fills in the remaining volume of the connection post forms. The dielectric component substrate 28 can be a planarizing layer.

In some embodiments, a patterned dielectric structure 24 is formed or otherwise disposed on an electronic device 20 to protect the electronic device 20 and vias are formed in the component substrate 28 to form openings for electrical contacts 22. Electrical conductors, such as electrodes 30, are formed in electrical contact with the device electrical contacts 22 over the component substrate 28. The patterned dielectric structure 24 can be, for example, silicon dioxide and the electrodes 30 can be metal deposited and patterned using photolithographic materials and methods such as coating, sputtering, or evaporation, and etching with patterned photoresist. An optional encapsulation layer 26 can be provided over the electrodes 30. In some embodiments, the optional encapsulation layer 26 can provide one or more tethers 50 or a layer or portion of the one of more tethers 50.

Sacrificial portions of a printable electronic source wafer 12 are etched to release a plurality of printable electronic components 10 or electronic devices 20 from the source wafer 12, except for the tether(s) 50 attaching the printable electronic components 10 or electronic devices 20 to corresponding anchors 52. Sacrificial portions can be, for example, an oxide layer or a designated anisotropically etchable portion of a source wafer 12. The plurality of printable electronic components 10 or electronic devices 20 are micro-transfer printed from the source wafer 12 to the destination substrate 60 and can have a fractured or separated tethers 50 as a consequence of removal from the source wafer 12 by a transfer device (e.g., stamp, such as an elastomeric stamp).

A transfer print process can be repeated with a plurality of printable source wafers 12 that each can be etched and their printable electronic components 10 or electronic devices 20 micro-transfer printed onto a destination substrate 60.

Formation of connection posts 40 is discussed in more detail in U.S. patent application Ser. No. 14/822,864, entitled "Chiplets with Connection Posts" by Prevatte et al., filed Aug. 10, 2015.

A printable electronic component 10 or electronic device 20 can be an active component, for example including one or more active elements such as electronic transistors or diodes or light-emitting diodes and photodiodes that produce an electrical current in response to ambient light. A printable electronic component 10 can be or include a semiconductor electronic device 20 having one or more semiconductor layers, such as an integrated circuit or light-emitting diode. A printable electronic component 10 or electronic device 20 can be or comprise an unpackaged die. A printable electronic component 10 can include passive components, for example including one or more passive elements such as resistors, capacitors, or conductors. In some embodiments, a printable electronic component 10 includes both active and passive elements. In some embodiments, a printable electronic component 10 comprises a plurality of active or passive elements, such as multiple semiconductor devices with separate substrates, each with one or more active elements such as multiple electronic devices 20. A printable electronic component 10 can itself be transfer printed (e.g., micro-transfer printed) from a source wafer 12 after elements have been arranged thereon and released therefrom, and thus include at least one fractured or separated tether 50. Elements can include or be electronic processors, controllers, drivers, light-emitting diodes, photodiodes, light-control devices, or light-management devices.

Printable electronic components 10 can include active elements such as electronic circuits formed using lithographic processes and can include passive elements such as electrical connections, e.g., wires 32 or electrodes 30, to device electrical contacts 22 and connection posts 40. Active or passive elements can be made in or disposed on a component substrate 28 or layers provided thereon, for example by transfer printing (e.g., micro-transfer printing) or photolithographic processes. In certain embodiments, device electrical contacts 22 are planar electrical connections formed on a side of a printable electronic component 10. Such device electrical contacts 22 are typically formed from metals such as aluminum or polysilicon using masking and deposition processes used in the art. In certain embodiments, device electrical contacts 22 are electrically connected to a circuit with electrodes 30 such as wires 32. In some embodiments, device electrical contacts 22 and a circuit, together with other functional structures formed in the active layer on the source wafer 12 make up a printable electronic component 10.

Printable electronic components 10 made by methods in accordance with some embodiments of the present disclosure can include a variety of electronic devices 20 such as chiplets having semiconductor structures, a diode, a light-emitting diode (LED), a transistor, or a laser (e.g., a diode laser). Chiplets are small integrated circuits and can be unpackaged dies released from a source wafer 12 and can be micro transfer printed. Likewise, printable electronic components 10 can be unpackaged. An unpackaged electronic component 10 has electronic device(s) 20 that are exposed to the environment (e.g., even if an encapsulation layer 26 is provided) and is not located within a separate packaging container, for example with wire bonds connected to electrically conductive pins extending from the package. Chiplets can have at least one of a width, length, and height from 2 to 50 µm (e.g., 2 to 5 µm, 5 to 10 µm, 10 to 20 µm, or 20 to 50 µm). Chiplets can have a semiconductor substrate thickness of 2 to 50 µm (e.g., 2 to 5 µm, 5 to 10 µm, 10 to 20 µm, or 20 to 50 µm). Chiplets can include a doped or undoped semiconductor substrate. Chiplet or active elements can be micro-light-emitting diodes with a length greater than width, for example having an aspect ratio greater than or equal to 2, 4, 8, 10, 20, or 50 and device electrical contacts 22 that are adjacent to ends of printable semiconductor components along the lengths of the printable semiconductor components. This structure enables low-precision manufacturing processes to electrically connect wires 32 to device electrical contacts 22 without creating registration problems and possible unwanted electrical shorts or opens.

Methods of forming such structures are described, for example, in the paper "AMOLED Displays using Transfer-Printed Integrated Circuits" and U.S. Pat. No. 8,889,485. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound micro-assembly structures and methods can also be used in some embodiments, for example, as described in U.S. patent application Ser. No. 14/822,868, filed Aug. 10, 2015, entitled Compound Micro Assembly Strategies and Devices, the disclosure of which is hereby incorporated by reference in its entirety.

A printable electronic component source wafer 12 in accordance with certain embodiments can be provided with printable electronic components 10, release layer (sacrificial layer), tethers 50, and connection posts 40 already formed, or they can be constructed during a method. Similarly, any source wafers 12 having micro-transfer printable electronic devices 20 thereon can be constructed or transfer printed during a method.

Connection posts 40 are electrical connections formed on a side (e.g., post side 21) of a printable electronic component 10 that extend generally perpendicular to a surface of the post side 21. Such connection posts 40 can be formed from metals such as aluminum, titanium, tungsten, copper, silver, gold, or other conductive metals. In some embodiments, connection posts 40 are made of one or more high elastic modulus metals, such as tungsten. As used herein, a high elastic modulus is an elastic modulus sufficient to maintain the function and structure of the connection posts 40 when pressed into a destination substrate 60 contact pads 62 or notch conductors 86.

Connection posts 40 can have a variety of aspect ratios and typically have a peak area smaller than a base area. Connection posts 40 can have a sharp point for embedding in or piercing destination substrate 60 contact pads 62. Connection posts 40 can include a post material coated with an electrically conductive material different from the post material. The post material can be an electrically conductive metal or a doped or undoped semiconductor or an electrically insulating polymer, for example a resin, cured, resin, or epoxy and can have any of a variety of hardness or elastic modulus values. In some embodiments, a post material is softer than a conductive material so that the conductive material can deform or crumple when the connection post 40 is under mechanical pressure. Deformation or crumpling can improve the electrical connection between connection posts 40 and contact pads 62 or notch conductors 86 by increasing the surface area that is in contact between the connection posts 40 and the contact pads 62 or notch conductors 86. To facilitate deformation, in some embodiments, connection posts 40 have a composition softer than that of contact pads 62 or notch conductors 86, or both, or the contact pads 62 or notch conductors 86, or both, have a composition softer than connection posts 40. In some embodiments, a conductive material is softer than a post material so that it deforms before the post material when under mechanical pressure. By deform is meant that connection posts 40 or contact pads 62 or notch conductors 86 or conductive material change shape [e.g., as a consequence of a transfer printing (e.g., micro-transfer printing)].

Coatings, such as a conductive material can be evaporated or sputtered over a post material structure and then pattern-wise etched to form a connection post 40. A conductive material can be a solder or other metal or metal alloy that flows under a relatively low temperature, for example less than 120 degrees C. In particular, a conductive material can have a melting point less than the melting point of a post material.

In certain embodiments, contact pads 62 (if present) and notch conductors 86 comprise a material that is softer than that of a connection post 40. In certain embodiments, connection posts 40 comprise a material that is softer than that of contact pads 62 (if present) or notch conductors 86. In certain embodiments, a conductive material other than a material of a destination substrate contact pad 62 and notch conductor 86 or connection post 40 adheres or electrically connects, or both, the contact pad 62 and notch conductor 86 to the connection post 40 (e.g., an adhesive or solder). In certain embodiments, a contact pad 62 or notch conductor 86 is welded to a connection post 40.

destination substrate 60 contact pads 62 or notch conductors 86 can be made of a relatively soft metal, such as tin, solder, or tin-based solder, to assist in forming good electrical contact with connection posts 40 and adhesion with the printable electronic components 10 that comprise the connection posts 40. As used herein, a soft metal may refer to a metal into which a connection post 40 can be pressed to form an electrical connection between the connection post 40 and a contact pad 62 or notch conductor 86. In this arrangement, the contact pad 62 or notch conductor 86 can plastically deform and flow under mechanical pressure to provide a good electrical connection between the connection post 40 and the contact pad 62 and notch conductor 86.

In some embodiments, connection posts 40 include a soft metal and contact pads 62 or notch conductors 86 include a high elastic modulus metal. In this arrangement, the connection posts 40 or notch conductors 86 can plastically deform and flow under mechanical pressure to provide a good electrical connection between the connection posts 40 and the contact pads 62 or notch conductors 86.

In some embodiments, printable electronic components 10 include small integrated circuits such as LEDs or assemblies of such small integrated circuits formed in or disposed on a semiconductor wafer, for example gallium arsenide or silicon, which can have a crystalline structure. Processing technologies for these materials typically employ high heat and reactive chemicals. However, by employing transfer printing technologies (e.g., micro-transfer printing) that do not stress the printable electronic component 10 or substrate materials, more benign environmental conditions can be used compared to thin-film manufacturing processes. Thus, certain embodiments of the present disclosure have an advantage in that flexible substrates, such as polymeric substrates, that are intolerant of extreme processing conditions (e.g. heat, chemical, or mechanical processes) can be employed for destination substrates 60. Furthermore, it has been demonstrated that crystalline semiconductor substrates have strong mechanical properties and, in small sizes, can be relatively flexible and tolerant of mechanical stress. This is particularly true for substrates having 5-micron, 10-micron, 20-micron, 50-micron, or even 100-micron thicknesses. In some embodiments, printable electronic components 10 can be formed in a microcrystalline, polycrystalline, or amorphous semiconductor layer.

Printable electronic components 10 can be constructed using foundry fabrication processes used in the art. Layers of materials can be used, including materials such as metals, oxides, nitrides and other materials used in the integrated-circuit art. Each printable electronic component 10 can be or include a complete semiconductor integrated circuit and can include, for example, transistors. Printable electronic components 10 can have different sizes, for example, no more than 1000 square microns, no more than 10,000 square microns, no more than 100,000 square microns, or no more than 1 square mm, or larger, and can have variable aspect ratios, for example 1:1, 2:1, 5:1, or 10:1. Printable electronic components 10 can be rectangular or can have other shapes.

A transfer device can be used to transfer (e.g., laterally) one or more printable electronic components 10. A transfer device can be, for example, a stamp, an electrostatic transfer device, or a vacuum transfer device. In some embodiments, a transfer device is a stamp. For example, a stamp can be an elastomeric stamp (e.g., comprising PDMS). A transfer device can comprise one or more pillars (e.g., posts) for picking up printable electronic components 10. For example, a transfer device can be an elastomeric stamp comprising a plurality of pillars (e.g., posts), each sized and shaped to pick up and transfer an individual printable electronic component 10.

Certain embodiments of the present disclosure provide advantages over other printing methods described in the prior art. By employing connection posts 40 on printable electronic components 10 and a printing method that provides printable electronic components 10 on a destination substrate 60 and connection posts 40 adjacent to the destination substrate 60, a low-cost method for printing chiplets in large quantities over a destination substrate 60 is provided. Furthermore, in some embodiments, additional process steps for electrically connecting the printable electronic components 10 to the destination substrate 60 are obviated.

A source wafer 12 and printable electronic components 10, transfer devices (e.g., micro-transfer printing stamps), and destination substrates 60 can be made separately and at different times or in different temporal orders or locations and provided in various process states.

Methods in accordance with certain embodiments of the present disclosure can be iteratively applied to single or multiple destination substrates 60. By repeatedly transferring sub-arrays of printable electronic components 10 from a transfer device (e.g., stamp) to a destination substrate 60 and relatively moving the transfer device (e.g., stamp) and destination substrate 60 between stamping operations by a distance equal to a size of the transferred sub-array of the selected printable electronic components 10 between each transfer of printable electronic components 10, an array of printable electronic components 10 formed at a high density on a source wafer 12 can be transferred to a destination substrate 60 at a much lower density. In practice, a source wafer 12 is likely to be expensive, and forming printable electronic components 10 with a high density on the source wafer 12 will reduce the cost of the printable electronic components 10, especially as compared to forming printable electronic components 10 on a destination substrate 60.

In some embodiments, wherein an active printable electronic component 10 is or includes an integrated circuit formed in a crystalline semiconductor material, the integrated circuit substrate provides sufficient cohesion, strength, and flexibility that it can adhere to a destination substrate 60 without breaking as the transfer device is removed.

In comparison to thin-film manufacturing methods, using densely populated source wafers 12 and transferring printable electronic components 10 to a destination substrate 60 that requires only a sparse array of printable electronic components 10 located thereon does not waste or require active layer material on a destination substrate 60. Certain embodiments of the present disclosure can also be used in transferring printable electronic components 10 made with crystalline semiconductor materials that have higher performance than thin-film active components. Furthermore, the flatness, smoothness, chemical stability, and heat stability requirements for a destination substrate 60 used in some embodiments of the present disclosure may be reduced because the adhesion and transfer process is not substantially limited by the material properties of the destination substrate 60. Manufacturing and material costs may be reduced because of high utilization rates of more expensive materials (e.g., the source substrate) and reduced material and processing requirements for a destination substrate 60.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

The terms row and column are arbitrary and relative designations and can be exchanged in various embodiments.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. Certain embodiments of the present disclosure have been described in detail, but it will be understood that variations and modifications can be effected within the spirit and scope of the invention.

PARTS LIST

A cross section
10 electronic component
12 source wafer
20 electronic device
20R red LED 20G green LED
20B blue LED
20C controller
21 post side
22 electrical contacts
23 stamp side
24 dielectric structure
26 encapsulation layer
28 component substrate
30 electrode
32 wires
40 connection post
42 bulb
44 electrical conduction layer
46 dielectric layer
48 socket opening
48 tether
50 anchor
52 destination substrate
60 substrate surface
61 contact pad
62 substrate conductor
80 interconnect structure
82 notch
83 dielectric layer
84 opening
86 notch conductor
87 electrical conductor layer
88 neck/mid-portion
99 transfer print structure
100 provide source wafer step
110 provide stamp step
120 provide interconnect structure step
130 contact component with stamp step
140 transport stamp and component step
150 move component laterally into interconnect structure step

What is claimed is:

1. A transfer print structure, comprising:
a destination substrate having a substrate surface and one or more substrate conductors disposed on or in the destination substrate; and
one or more interconnect structures disposed on and protruding from the destination substrate in a direction orthogonal to the substrate surface, each of the one or more interconnect structures comprising one or more notches, each of the one or more notches (i) having an opening on an edge of the interconnect structure and extending at least partially through the interconnect structure in a direction parallel to the substrate surface from the edge of the interconnect structure, (ii) comprising a notch conductor disposed at least partially in the notch and (iii) electrically connected to at least one of the one or more substrate conductors.

2. The transfer print structure of claim 1, wherein each of the one or more interconnect structures comprises a dielectric layer and an electrical conductor layer disposed at least partly on the dielectric layer, the electrical conductor layer forming at least a portion of the notch conductor of the one or more notches.

3. The transfer print structure of claim 1, wherein each of the one or more notches extends only partially through the interconnect structure in a direction parallel to the substrate surface.

4. The transfer print structure of claim 1, wherein each of the one or more notches has opposing ends and one end is wider than the other end in a direction parallel to the substrate surface.

5. The transfer print structure of claim 1, wherein each of the one or more notches has opposing ends and a mid-portion of the notch between the ends is narrower than portions of the notch to either side of the mid-portion in a direction parallel to the substrate surface.

6. The transfer print structure of claim 1, wherein each of the one or more notches has a slot portion adjacent to the substrate surface that is wider than a portion of the notch on a side of the slot portion opposite the substrate surface in a direction orthogonal to the substrate surface.

7. The transfer print structure of claim 1, wherein at least one of the one or more interconnect structures comprises two notches, and the notch conductors of the two notches are electrically separate.

8. The transfer print structure of claim 1, wherein at least one of the one or more interconnect structures comprises two notches, and the notch conductors of the two notches are electrically connected.

9. The transfer print structure of claim 1, comprising one or more electronic components, each of the one or more electronic components comprising one or more electrically conductive connection posts, wherein each of the one or more connection posts is in electrical contact with the notch conductor of a corresponding notch of one or more notches.

10. The transfer print structure of claim 9, wherein each of the one or more electronic components comprises a dielectric substrate and one or more electronic devices disposed on the dielectric substrate, wherein at least one of the one or more electronic devices is electrically connected to a connection post of the electronic component.

11. The transfer print structure of claim 9, comprising a contact pad disposed on the substrate surface, the contact pad electrically connected to at least one of the one or more connection posts of one of the one or more electronic components and the notch conductor of each corresponding notch.

12. The transfer print structure of claim 9, wherein each of the one or more connection posts has a diameter that is substantially the same as a width of the opening of the corresponding notch.

13. The transfer print structure of claim 9, wherein the corresponding notch for each of the one or more connection posts is shaped to hold the connection post in place.

14. The transfer print structure of claim 9, wherein, for each of the one or more notches of each of the one or more interconnect structures, (i) the notch extends only partially through the interconnect structure that comprises the notch in a direction parallel to the substrate surface, (ii) the notch has a wide end that is wider and closer to the edge of the interconnect structure than an opposing narrow end in a direction parallel to the substrate surface, the narrow end extending into the interconnect structure that comprises the notch and having a width that is substantially the same as or less than a diameter of the connection post that corresponds to the notch.

15. The transfer print structure of claim 9, comprising a contact pad for each of the one or more notches of each of the one or more interconnect structures, wherein the contact pad is disposed on the substrate surface at least partially within the notch, is electrically connected to the notch conductor of the notch, and is in direct physical contact with the connection post that corresponds to the notch.

16. The transfer print structure of claim 9, wherein each of the one or more connection posts comprises a bulb disposed at a distal end of the connection post that has a diameter that is greater than a diameter of the connection post between the bulb and a proximal end of the connection post.

17. The transfer print structure of claim 9, wherein, for each of the one or more electronic components, each connection post comprises an L shape with a portion extending away from and substantially orthogonal to a substrate of the electronic component and a portion extending substantially parallel to the substrate.

18. The transfer print structure of claim 9, wherein at least one of the one or more interconnect structures forms a rail and at least one of the one or more electronic components comprises connection posts that form a socket with a socket opening and at least one of the rail and the socket opening is wedge shaped.

19. The transfer print structure of claim 1, wherein each of the one or more notches of each of the one or more interconnect structures is disposed at least partially between at least a portion of the interconnect structure comprising the notch and the substrate surface.

20. The transfer print structure of claim 1, wherein at least one of the one or more interconnect structures forms a rail.

* * * * *